United States Patent
Liu et al.

(10) Patent No.: US 9,941,240 B2
(45) Date of Patent: Apr. 10, 2018

(54) SEMICONDUCTOR CHIP SCALE PACKAGE AND MANUFACTURING METHOD THEREOF

(71) Applicant: TAIWAN SEMICONDUCTOR MANUFACTURING COMPANY LTD., Hsinchu (TW)

(72) Inventors: Ming-Kai Liu, New Taipei (TW); Chun-Lin Lu, Hsinchu (TW); Kai-Chiang Wu, Hsinchu (TW); Shih-Wei Liang, Taichung County (TW); Ching-Feng Yang, Taipei (TW); Yen-Ping Wang, Changhua County (TW); Chia-Chun Miao, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 13/934,982

(22) Filed: Jul. 3, 2013

(65) Prior Publication Data
US 2015/0008575 A1 Jan. 8, 2015

(51) Int. Cl.
*H01L 23/00* (2006.01)

(52) U.S. Cl.
CPC ............. *H01L 24/81* (2013.01); *H01L 24/06* (2013.01); *H01L 24/14* (2013.01); *H01L 24/16* (2013.01);
(Continued)

(58) Field of Classification Search
CPC ............... H01L 2924/00; H01L 24/81; H01L 2224/73265; H01L 2224/48227; H01L 2224/73204
See application file for complete search history.

(56) References Cited

U.S. PATENT DOCUMENTS 6,333,104 B1 * 12/2001 Perry et al. .................. 428/328
7,564,130 B1 * 7/2009 Li .......................... H01L 24/14
257/734
(Continued)

FOREIGN PATENT DOCUMENTS

CN 1585121 2/2005
CN 1585121 A 2/2005
(Continued)

OTHER PUBLICATIONS

Office action dated Jun. 10, 2015 from Taiwan Intellectual Property Office for corresponding Taiwan application 10420761090.
(Continued)

*Primary Examiner* — Thao X Le
*Assistant Examiner* — Xia Cross
(74) *Attorney, Agent, or Firm* — WPAT, P.C., Intellectual Property Attorneys; Anthony King

(57) ABSTRACT

A surface mounting semiconductor component includes a semiconductor device, a circuit board, a number of first solder bumps, and a number of second solder bumps. The semiconductor device included a number of die pads. The circuit board includes a number of contact pads. The first solder bumps are configured to bond the semiconductor device and the circuit board. Each of the first solder bumps connects at least two die pads with a corresponding contact pad. Each of the second solder bumps connects a die pad with a corresponding contact pad. A method of forming a surface mounting component or a chip scale package assembly wherein the component or assembly has at least two different types of solder bumps.

18 Claims, 24 Drawing Sheets

(52) U.S. Cl.
CPC ............. *H01L 24/17* (2013.01); *H01L 24/13* (2013.01); *H01L 2224/02375* (2013.01); *H01L 2224/0401* (2013.01); *H01L 2224/05548* (2013.01); *H01L 2224/06152* (2013.01); *H01L 2224/06179* (2013.01); *H01L 2224/13005* (2013.01); *H01L 2224/13028* (2013.01); *H01L 2224/13116* (2013.01); *H01L 2224/1403* (2013.01); *H01L 2224/14152* (2013.01); *H01L 2224/14179* (2013.01); *H01L 2224/14515* (2013.01); *H01L 2224/1601* (2013.01); *H01L 2224/16058* (2013.01); *H01L 2224/16105* (2013.01); *H01L 2224/16106* (2013.01); *H01L 2224/1703* (2013.01); *H01L 2224/17051* (2013.01); *H01L 2224/17104* (2013.01); *H01L 2224/17515* (2013.01); *H01L 2224/48227* (2013.01); *H01L 2224/73204* (2013.01); *H01L 2224/73265* (2013.01); *H01L 2224/81191* (2013.01); *H01L 2224/81192* (2013.01); *H01L 2224/81815* (2013.01); *H01L 2924/01322* (2013.01)

(56) References Cited

U.S. PATENT DOCUMENTS

| | | | |
|---|---|---|---|
| 7,938,311 B2 * | 5/2011 | Marion | H01L 23/49811 228/180.22 |
| 2002/0100955 A1 | 8/2002 | Potter et al. | |
| 2002/0158110 A1 * | 10/2002 | Caletka | B23K 3/0623 228/180.22 |
| 2011/0042798 A1 * | 2/2011 | Pagaila et al. | 257/692 |
| 2011/0248399 A1 * | 10/2011 | Pendse | 257/737 |
| 2012/0032314 A1 * | 2/2012 | Chen et al. | 257/666 |
| 2013/0134582 A1 | 5/2013 | Yu et al. | |
| 2013/0228916 A1 * | 9/2013 | Mawatari | 257/737 |
| 2014/0015131 A1 * | 1/2014 | Meyer | H01L 23/49816 257/738 |

FOREIGN PATENT DOCUMENTS

| | | |
|---|---|---|
| CN | 1851912 A | 10/2006 |
| CN | 103137596 A | 6/2013 |

OTHER PUBLICATIONS

English abstract translation of the office action dated Jun. 10, 2015 from Taiwan Intellectual Property Office for corresponding Taiwan application 10420761090.
Office action from the Taiwan patent office for the counterpart application 10620543890 dated May 19, 2017.
English abstract translation for CN1585121.
Office Action dated Dec. 4, 2017 for the Taiwan counterpart application 103103108.
English abstract translation of CN1851912.
English abstract translation of CN1585121.
US20130134582A1 is the counterpart for CN103137596A.

* cited by examiner

US 9,941,240 B2

SEMICONDUCTOR CHIP SCALE PACKAGE AND MANUFACTURING METHOD THEREOF

FIELD

The disclosure relates to a semiconductor device, and more particularly to a chip scale package and methods of chip scale packaging.

BACKGROUND

Chip scale packages (CSP) are widely adopted for semiconductor chip assemblies in the industry because the component has a smaller size. A popular methodology of manufacturing a CSP component is a technology called surface mounting technology (SMT). The surface mounting technology is a method in which the semiconductor chip is mounted or placed directly on the surface of a printed circuit board (PCB). A semiconductor component made with SMT usually has either smaller bonding wires or no bonding wires at all.

The semiconductor component made with SMT is smaller in size and lower in electrical resistance. During manufacturing of the SMT semiconductor component, a ball grid array (BGA) is a type of packaging used for integrating the semiconductor chip and the printed circuit board. In BGA packaging, a number of solder balls are first disposed on either the pads of the semiconductor chip or the pads of the printed circuit board, and then the semiconductor chip and the circuit board are bonded through the solder balls.

By replacing the wires with the solder balls in the surface mounting component, the resistance and required package space are both reduced. However, similar to the bonding wires of the other packaging process, the reliability of the solder balls affects the manufacturing yield of the surface mounting technology. As such, improvements in the integrity and method for a solder ball to form in a surface mounting component continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

The different types of solder bumps are formed using a soldering material, for example, solder balls. Hereinafter, "solder bumps" refer to the connection member between the semiconductor device and the circuit board after the bonding processes.

For a surface mounting component or a chip scale package assembly, solder balls are bonded on the pads of a semiconductor device or a circuit board and form solder bumps to connect the semiconductor device with the circuit board. Stress distribution inside the solder bump is an issue. High stress in the corners of the solder bumps or on the contact surface between the solder bumps and the pad bonded thereon is causing the solder bumps to be vulnerable and may cause cracking and a bad electrical connection.

In the present disclosure, a package assembly or a component having a number of solder bumps are bonded on a semiconductor device and configured to connect the semiconductor device with a circuit board. Each of a number of elongated solder bumps is designed to be capable of having a low stress distributed at the corners of the solder bumps. In some embodiments, the solder bump is designed to have a low stress distribution on the surface between the solder bump and the pad that is in contact with the solder bump. In some embodiments, the stress distribution on most of the contact surface is substantially same with the stress distribution at the center of the solder bump. In some embodiments, the stress on most part of the contact surface is less than 1.2 times of the stress at the center of the solder bump.

In some embodiments, the stress on the corners of the solder bump is less than 1.2 times of the stress at the center of the solder bump.

A method according to the present disclosure is designed to form at least two different types of solder bumps in a surface mounting component or a chip scale package assembly. Solder bumps belong to the same type have a substantially same profile feature such as the wetting angle on the contact surface, or the aspect ratio of each solder bump. In some embodiments, a first type solder bumps are bridged in order to make a second type solder bumps have a smaller wetting angle, or a greater aspect ratio than the bridged solder bumps. Stress at the corners or on the contact surface with pads is reduced for the second type solder bumps due to a smaller wetting angle. In some embodiments, one type of solder bumps includes solder balls that are elongated after forming the surface mounting component of the chip scale package assembly. Stress at the corners or on the contact surface with pads is reduced for the elongated solder bumps. In some embodiments, the wetting angle of one type of solder bumps is smaller than 100 degrees.

Figure 1:
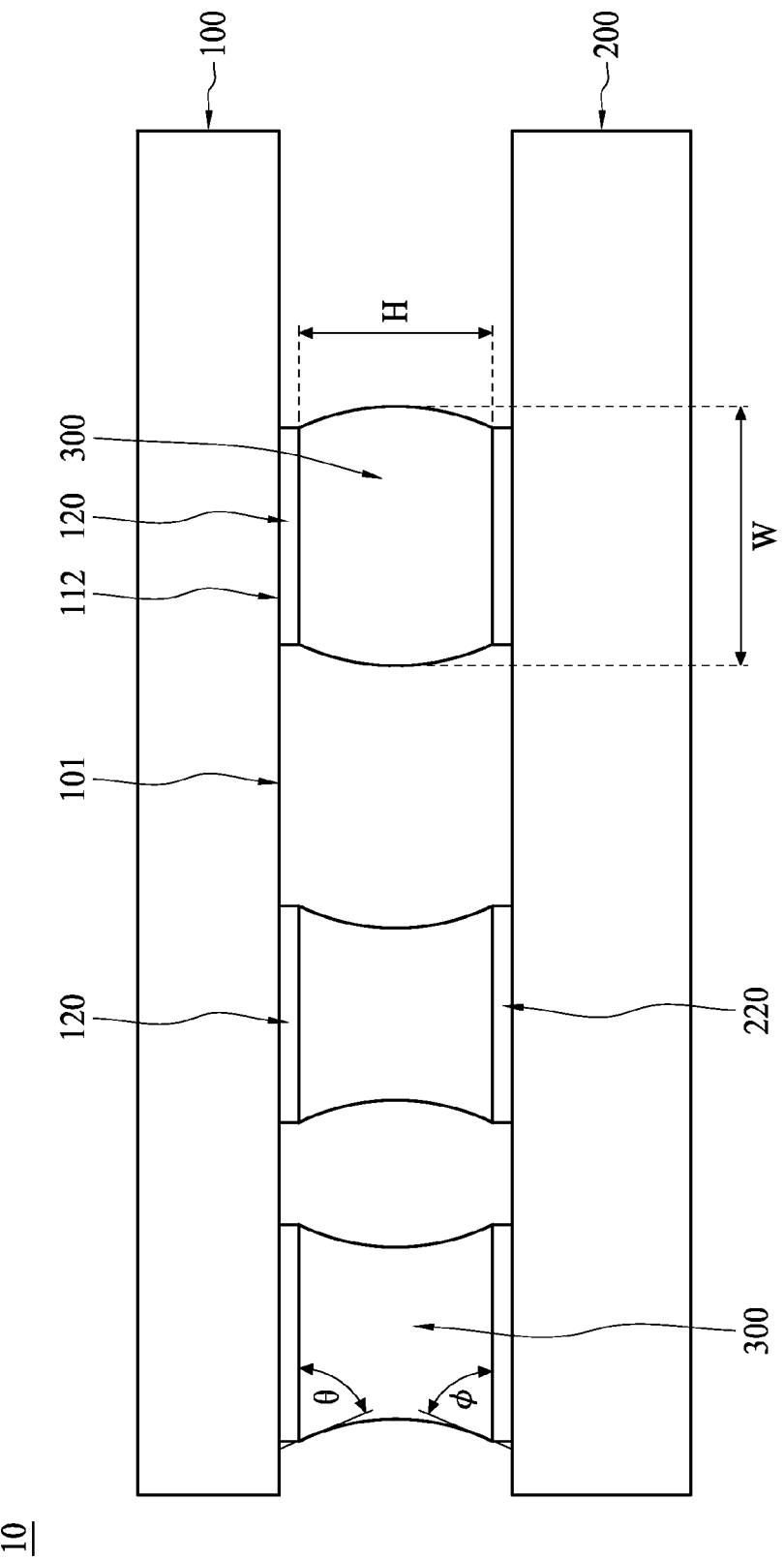
FIG. 1 is a schematic of a surface mounting component or a chip scale package assembly having a plurality of solder bumps in accordance with various embodiments of the present disclosure.

Referring to FIG. 1, a semiconductor conductor component 10 has a semiconductor device 100. The semiconductor device 100 is mounted on a circuit board 200 and connected with the circuit board 200 by a number of solder bumps 300. In some embodiments, the semiconductor device 100 is a semiconductor chip. In some embodiments, the semiconductor device is a component including a number of semiconductor chips. In still other embodiments, the semiconductor device is a wafer-level device including a number of semiconductor chips formed thereon. In some embodiments, the semiconductor device 100 has a plurality of through substrate via (TSV) or other circuitry to electrically communicate with other devices.

The semiconductor device 100 has a number of pads 120 disposed on a surface 101. The pads 120 are electrically conductive and designed to electrically communicate with the internal circuit of the semiconductor device 100. Each of the pads 120 is a metallurgical layer or metallurgical film stack. Each pad 120 is configured to receive at least a solder ball. In some embodiments, the pads 120 are the bonding pads of the semiconductor device 100 and the bonding pads are designed to directly communicate with the top metal layer of the semiconductor device's internal circuitry. In some embodiments, the pads 120 are the UBMs (Under Bump Metal) of the semiconductor device 100. The UBM pads 120 are connected with the internal circuit of the semiconductor device 100 through a conductive redistribution layer or a conductive post.

The circuit board 200 has a number of contact pads 220. The contact pads 220 are electrically conductive and configured to receive the solder balls that are bonded on the pads of the semiconductor device 100. The arrangement of the contact pads on the circuit board corresponds to the design of the pads of the semiconductor device. The contact pads 220 are electrically connected to the circuit of the circuit board. In some embodiments, the circuit board is a printed circuit board (PCB).

The solder balls are configured to be an intermediate to connect the semiconductor device 100 with the circuit board 200. A wide variety of materials can be selected for the solder balls such as metal or metal alloy. In some embodiments, the solder balls are Pb—Sn which has a low eutectic point and good adhesion with the pads or contact pads. In some embodiments, the solder ball material is a paste mixture of metallic powders and flux. The solder balls are disposed on the pads in various manners such as ball drop, spray, or stencil etc. In some embodiments, the solder balls are disposed first on the pads of the semiconductor device, and then mounted on the circuit board by contacting the solder balls with corresponding contact pads on the circuit board. In some embodiments, the solder balls are disposed first on the contact pads of the circuit board, and then mounted on the circuit board by contacting the solder balls with corresponding pads of the semiconductor device.

In some embodiments, each solder ball is bonded with only one pad of the semiconductor device and one contact pad of the circuit board to form a solder bump. In some embodiments, some solder balls are bonded with at least two pads of the semiconductor device and one pad of the circuit board to form a bridged solder bump.

Referring to FIG. 1, each solder bump 300 has several profile features, for example, a first wetting angle $\theta$ and a second wetting angle $\Phi$. The first wetting angle $\theta$ is the contact angle between the solder bump 300 and the pad 120 of the semiconductor device 100. The second wetting angle $\Phi$ is the contact angle between the solder bump 300 and the contact pad 220 of the circuit board 200. Another profile feature for each solder bump is a contact surface 112, which is the surface between the solder bump and the semiconductor device, including the pad. Still another profile feature for each solder bump is the aspect ratio. The aspect ratio of each solder bump is defined as the ratio of the height H of the solder bump divided by the central width W (full width at half height).

Figure 2:
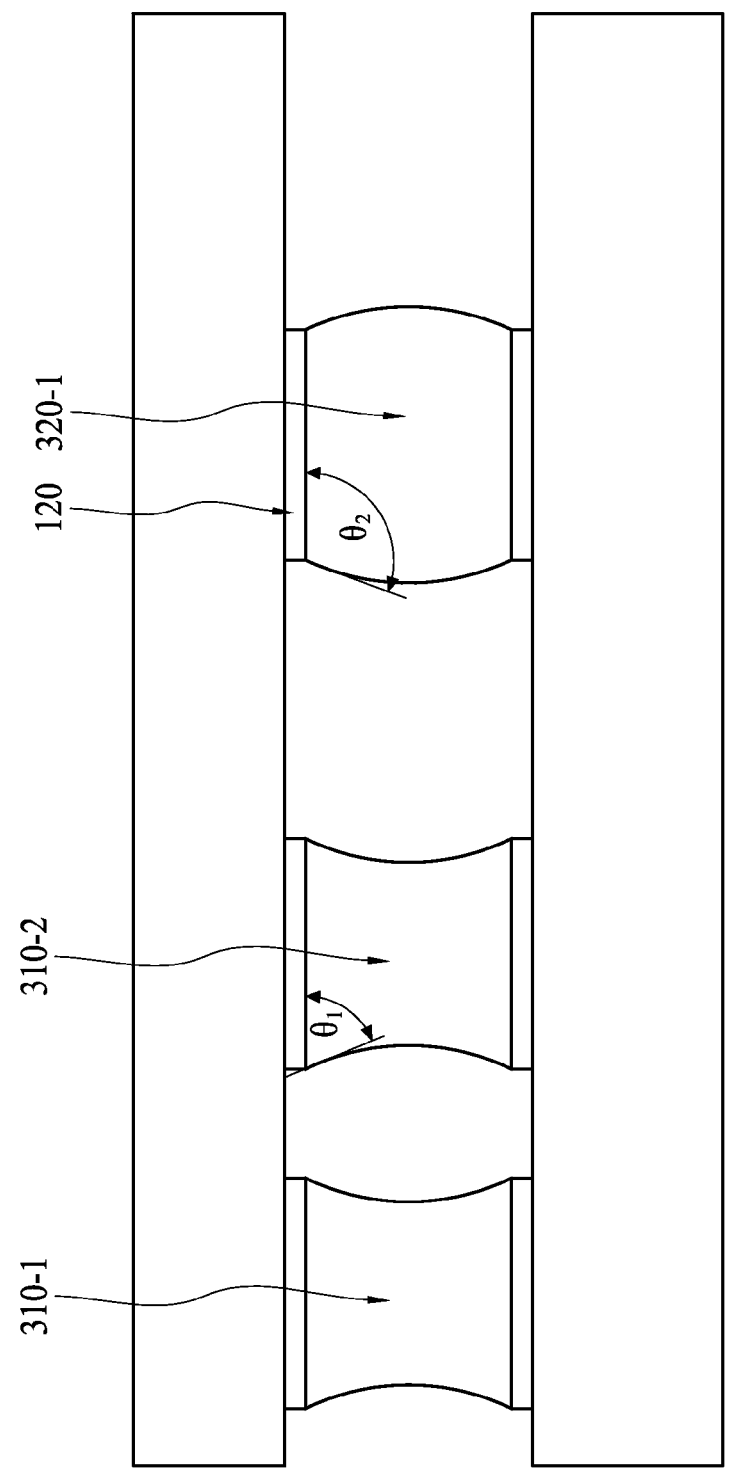
FIG. 2 is a schematic of a surface mounting component or a chip scale package assembly having a plurality of solder bumps featured with two different first wetting angles.

In some embodiments, solder bumps are categorized into at least two groups according to the difference in the first wetting angle $\theta$. Referring to FIG. 2, in a first group, solder bumps 310-1 and 310-2 have a substantially same first wetting angle $\theta_1$. In a second group, solder bumps, for example, bump 320-1 has a substantially first wetting angle $\theta_2$, which is different from $\theta_1$. The first wetting angle $\theta_2$ of each solder bump in the second group is greater than the first wetting angle $\theta_1$ of each solder bump in the first group, i.e. $\theta_2 > \theta_1$. In some embodiments, the first wetting angle $\theta_1$ is substantially smaller than 90 degrees. In some embodiments, the first wetting angle $\theta_1$ is substantially smaller than 80 degrees.

Figure 3:
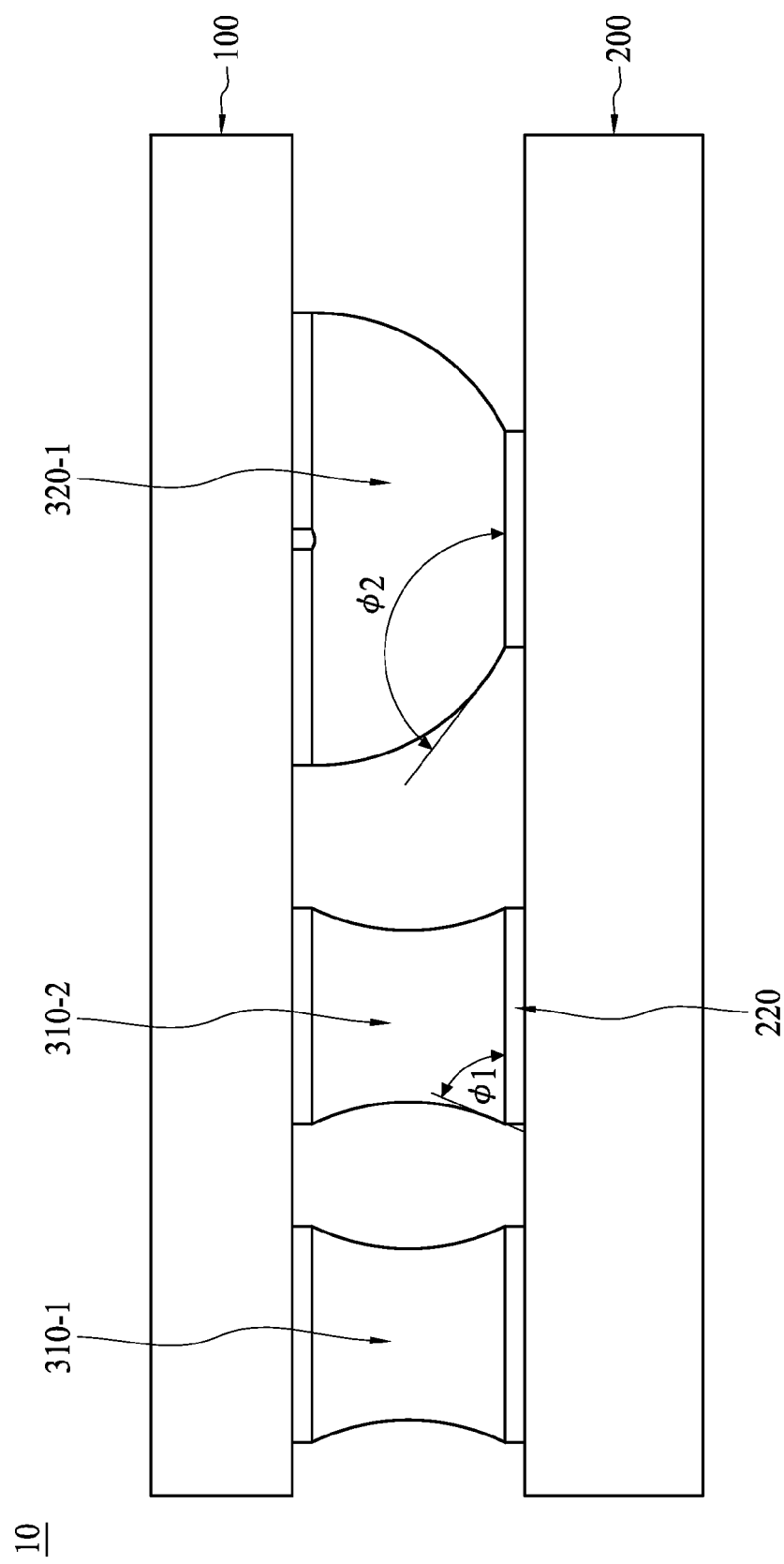
FIG. 3 is a schematic of a surface mounting component or a chip scale package assembly having a plurality of solder bumps featured with two different second wetting angles.

In some embodiments, solder bumps are categorized into at least two groups according to the difference in the second wetting angle $\Phi$. In some embodiments according to the present disclosure, solder bumps of one group have a second wetting angle $\Phi$ substantially smaller than or equal to 90 degrees. Referring to FIG. 3, solder pumps such as 310-1 and 310-2 have a substantially same second wetting angle $\Phi_1$, wherein $\Phi_1 \leq 90$ degrees. In some embodiments, the second wetting angle $\Phi_1$ is smaller than or equal to 80 degrees. In some embodiments, solder bumps in a first group, for example 310-1 and 310-2 have a substantially same second wetting angle $\Phi_1$. In a second group, a solder bump such as like 320-1 has a substantially same second wetting angle $\Phi_2$, which is different from $\Phi_1$. The second wetting angle $\Phi_2$ of the solder bumps in the second group are greater than the second wetting angle $\Phi_1$ of the solder bumps in the first group, i.e. $\Phi_2 > \Phi_1$.

Figure 4:
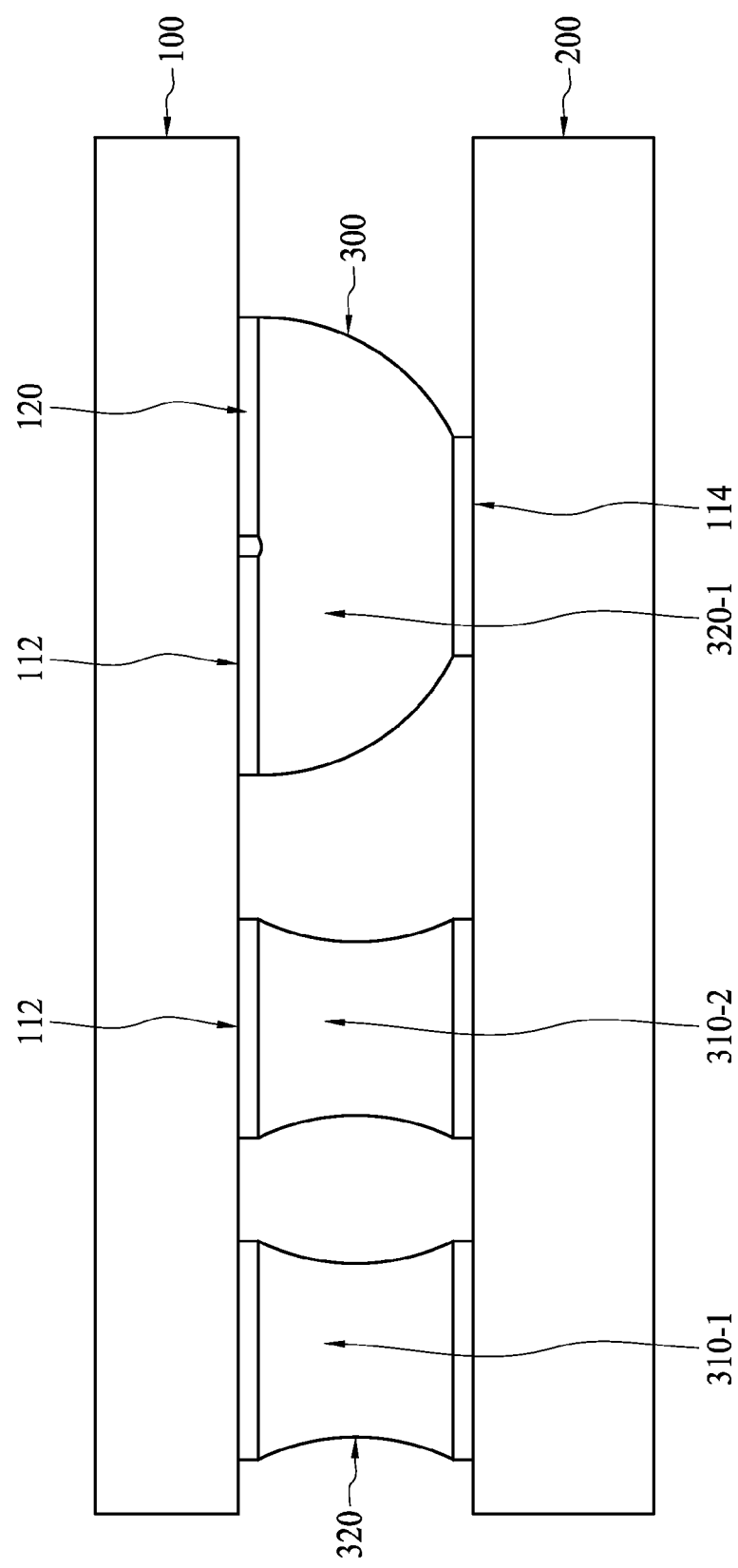
FIG. 4 is a schematic of a surface mounting component or a chip scale package assembly having a plurality of solder bumps featured with two different pad pitches.

In some embodiments according to the present disclosure, solder bumps are categorized into at least two groups according to the difference in the size of contact surface between the solder bump and the semiconductor device. Referring to FIG. 4, each solder bump has a contact surface 112 located between the solder bump and the semiconductor device 100, including the pad. Solder bumps 310-1 and 310-2 are categorized in a first group because each solder bump has a substantially same contact surface. Solder bump 320-1 represents a solder bump in a second group which has a contact surface size different from solder bump 310-1 or 310-2. In some embodiments, the contact surface size for a solder bump in the second group, is greater than the contact surface size for a solder bump in the first group. In some embodiments, the contact surface size for a solder bump in the second group is 30% is greater than the contact surface size for a solder bump in the first group. The contact surface size for a solder bump in the second group may be two times greater than the contact surface size of a solder bump in the first group. In some embodiments, a solder bump has a larger size for the contact surface between the solder bump and a semiconductor device than the contact surface between the solder bump and a circuit board. Referring to FIG. 4, the contact surface 112 between the solder bump 300 and the semiconductor device 100 is larger than the contact surface 114 between the solder bump 300 and the circuit board 200. In some embodiments, the contact surface 112 is two times greater than the contact surface 114.

Figure 5:
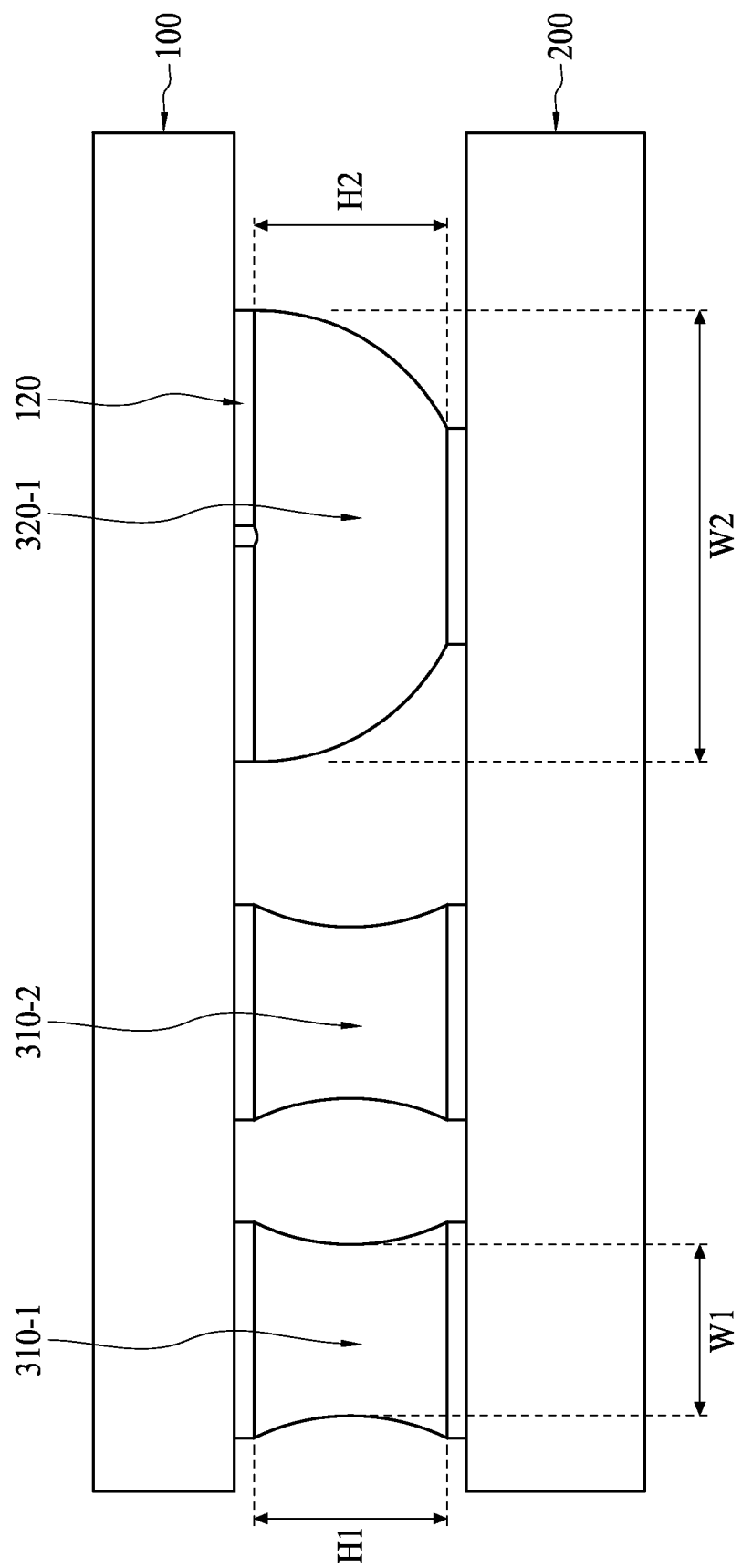
FIG. 5 is a schematic of a surface mounting component or a chip scale package assembly having a plurality of solder bumps featured with two different aspect ratios.

In some embodiment, solder bumps are categorized into at least two groups according to the difference in the aspect ratio. Referring to FIG. 5, in a first group, solder bumps for example 310-1 and 310-2 have a substantially same aspect ratio represented as H1/W1. In a second group, such as solder bump 320-1 has an aspect ratio represented as H2/W2. According to various embodiments, the aspect ratio H1/W1 of each solder bump in the first group is greater than the aspect ratio H2/W2 of each solder bump in the second group, i.e. H1/W1≥H2/W2. In some embodiments, the first aspect ratio H1/W1 is 50% greater than the second aspect ratio H2/W2. In some embodiments, the first aspect ratio H1/W1 is two times greater than the second aspect ratio H2/W2.

Pads on a semiconductor device are arranged in various manners in order to form at least two different types of solder bumps in a surface mounting component or a chip scale package assembly according to the different solder profiles. In some embodiments, pads on a semiconductor device are categorized into at least two groups according to the different pad sizes. Solder bumps disposed on the pads with a smaller sized pads cause solder bumps on the larger sized pads to be elongated. In some embodiments, pads on a semiconductor device are arranged into at least two groups according to the different pad pitches. Solder balls disposed on pads with a smaller pad pitch bridge, i.e. connect to its neighboring solder balls, after a heating operation. Solder bumps disposed on the pads with a smaller pad pitch cause solder bumps on the pads with a larger pad pitch elongated to have a different profile feature than the bridged solder bumps. In some embodiments, some pads on a semiconductor device are connected by at least one trace. The trace is designed to promote the bridging of solder bumps disposed thereon. Solder bumps not connected with the trace are elongated to have a different profile feature than the bridged solder bumps.

Figure 6:
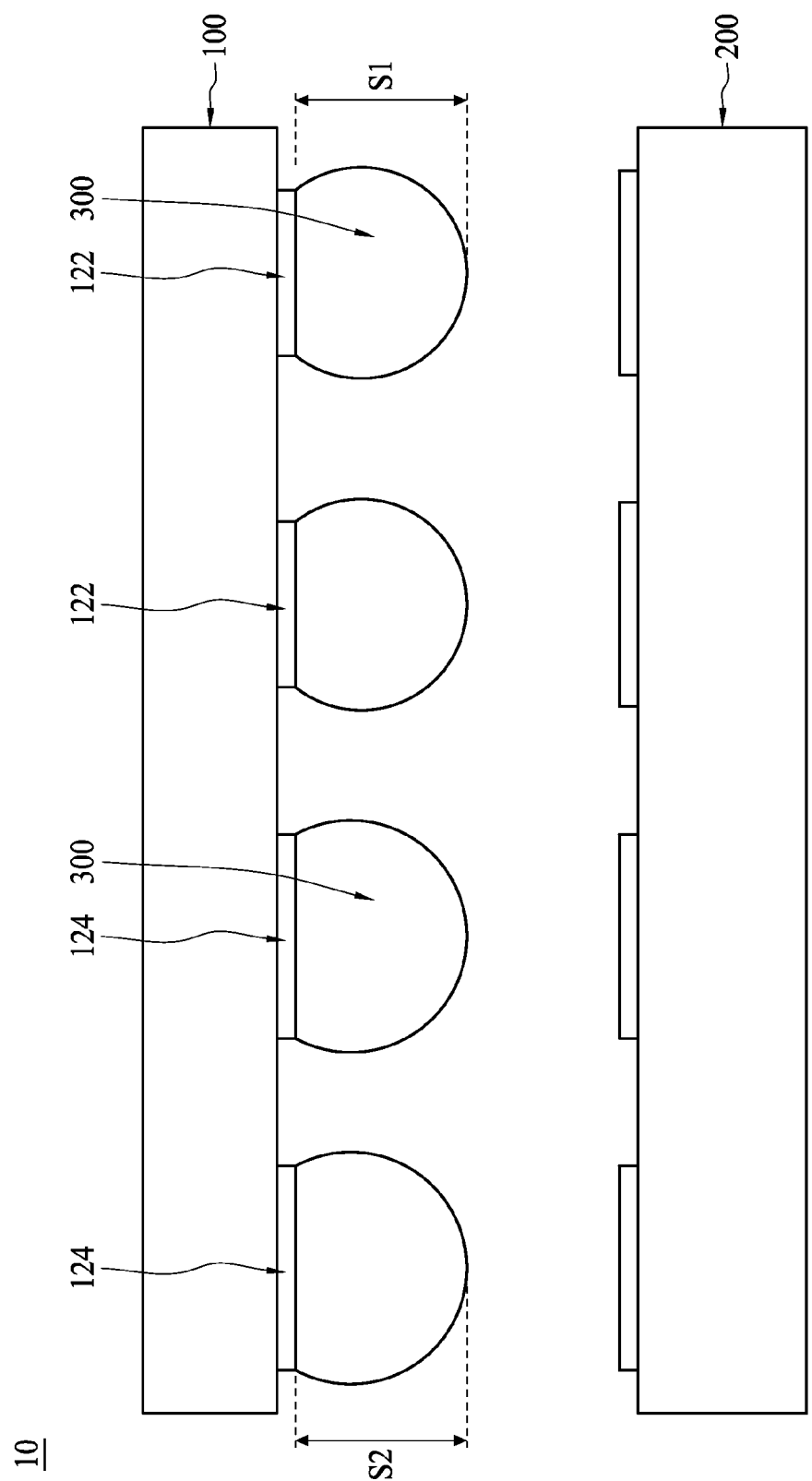
FIG. 6 is a schematic of a surface mounting component or a chip scale package assembly having a plurality of solder balls disposed on pads with two different pad sizes.

Referring to embodiments of FIG. 6, a number of a first type pads 122 and a number of a second type pads 124, are disposed on a semiconductor device 100. The first type pads 122 and the second type pads 124 differ in pad size. The pad size of the first type pads 122 is smaller than the pad size of the second type pad 124. A same volume solder ball is bonded on each pad of both types. Each solder ball 400 bonded on a first type pad 122 has a height $S_1$ and each solder ball 400 bonded on a first type pad 122 has a height $S_2$. Due to a smaller pad size, the height of each solder ball applied on a first type pad is greater than the height of each solder ball applied on a second type pad, i.e. $S_1 > S_2$. After mounting the semiconductor device 100 on a circuit board 200, the solder bumps on the first type pads force the solder bumps on the second type pads to elongate. In some embodiments, the pad size is between about 150 μm and 300 μm.

Figure 7:
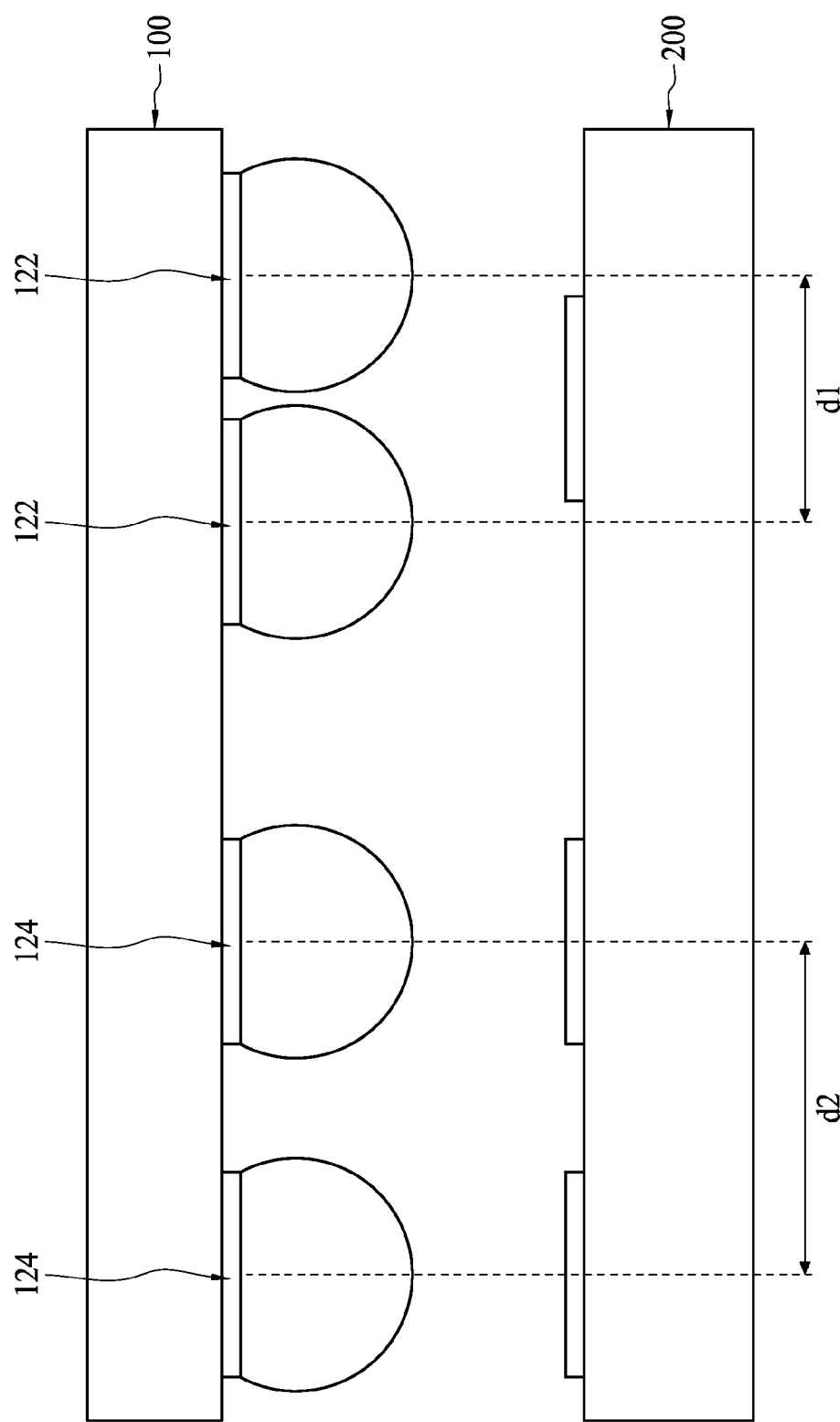
FIG. 7 is a schematic of a surface mounting component or a chip scale package assembly having a plurality of solder balls featured with two different solder ball gaps.

In some embodiments, pitch of the pads on a semiconductor device are arranged in order to form some bridged solder balls. Referring to FIG. 7, there are two groups of pads on a semiconductor device 100. Pads 122 are in a first group and pads 124 are in a second group. Pads of the first group are designed to have a smaller pad pitch than pads of the second group pads. The pad pitch is measured from the center of a pad to the center of an adjacent pad. Pad pitch for the first group pads 122 is d1 and pad pitch for the first group pads 124 is d2. Under a same condition (for example, disposing a solder ball with same volume on each of the first and second group pads), the pad pitch for pads of the first group is configured to be small enough to have each solder ball on a first pad bridge with another solder ball on an adjacent pad of the first group pad. The pad pitch for the pads of the second group is configured to be wide enough to avoid each solder ball on a second group pad bridging with another solder ball on an adjacent second group pad after bonding the semiconductor device to the circuit board.

In some embodiments, pad pitch d1 for the first group is between about 290 μm to 320 μm and pad pitch d2 for the second group is between about 390 μm and 410 μm. In some embodiments, pad pitch d1 is at least about 20% smaller than pad pitch d2. In some embodiments, pad pitch d1 is 30% smaller than pad pitch d2. In still other embodiments, pad pitch d1 is about 40% smaller than pad pitch d2. Each pad of the first group and each pad of the second group is configured to receive a solder ball before mounting the semiconductor on a circuit. In some embodiments, the size of the pad on a semiconductor device is between about 180 μm and 220 μm. The solder balls on the pads bridge after reflow. The reflow is implemented either before or after mounting the semiconductor on the circuit board.

Figure 8A:
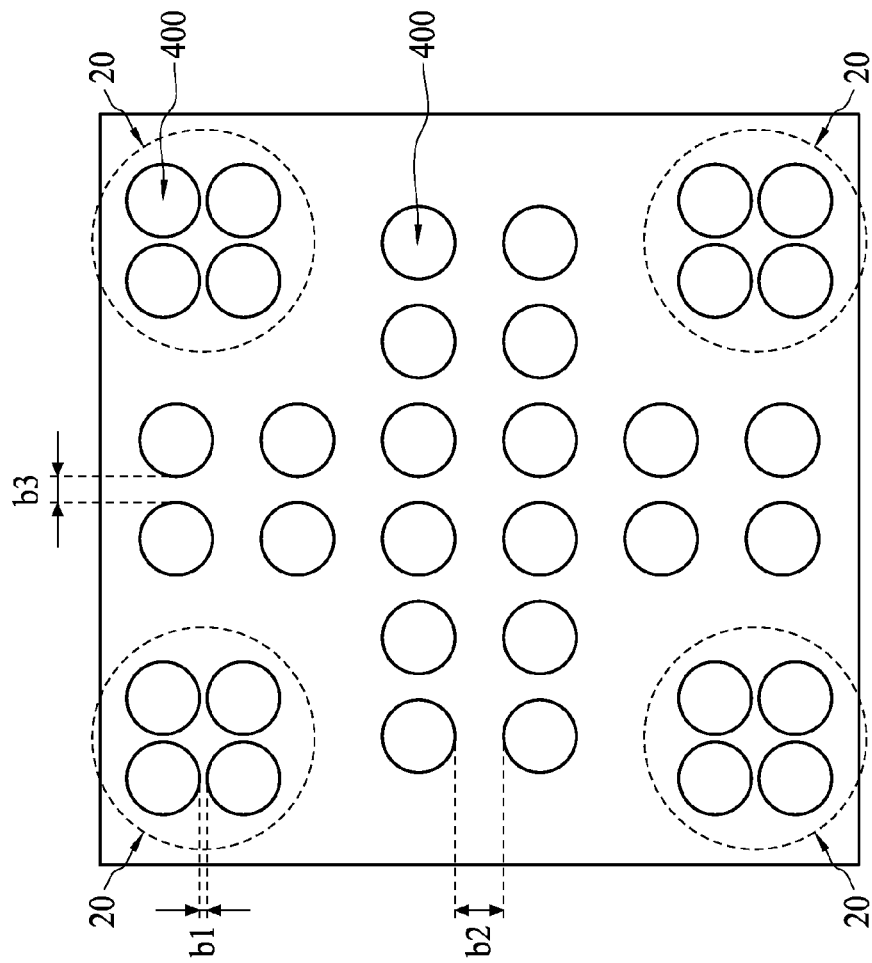
FIGS. 8A and 8B are plane views of a design of solder ball distribution according to some embodiments.
Figure 8B:
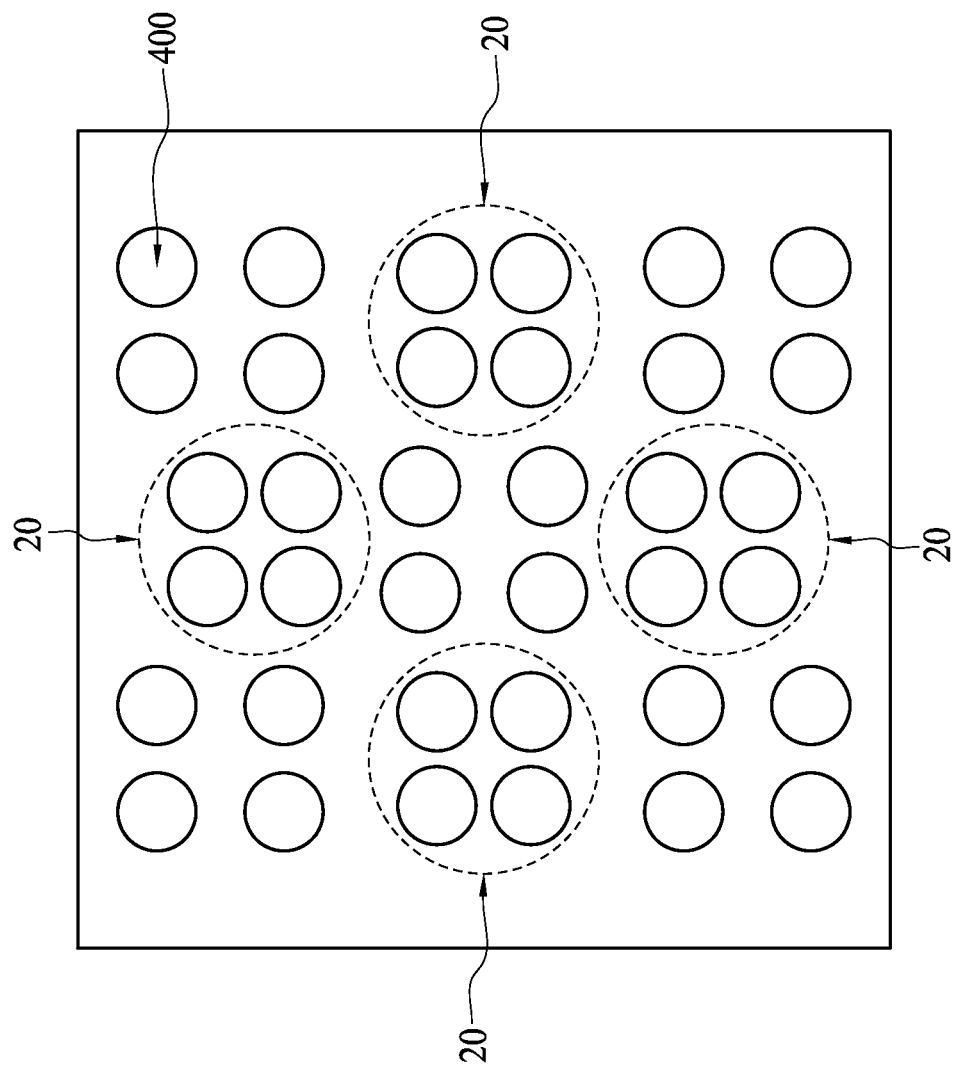

FIG. 8A is a plane view of the semiconductor device 100 shown in FIG. 7. Each pad is covered by a solder ball 400. A solder ball gap is defined, from a top view perspective, to be the shortest distance between two adjacent solder balls. Pads of the first group are located at several zones 20. In each zones 20, the solder ball gap b1 is smaller than the solder ball gap b2 or b3 of solder balls outside zone 20. In some embodiments, solder ball gap b1 is between about 40 μm and 60 μm. Solder ball gap b2 is between about 130 μm and 150 μm. The diameter of each solder ball is between about 240 μm and 265 μm. In some embodiments, solder ball gap b2 is about 2.5 times greater than solder ball gap b1. In some embodiments, solder ball gap b2 is about 3 times greater than solder ball gap b1. In some embodiments, the diameter of the solder ball is between about 200 μm and 300 μm. In FIG. 8B, solder balls 400 are arranged in a accordance with the underlying pad pattern. Pads with smaller pitch are disposed about to the center of the semiconductor device 100. Hence, solder balls with smaller solder ball gap in zones 20 are also about to the center of the semiconductor device 100.

Figure 9:
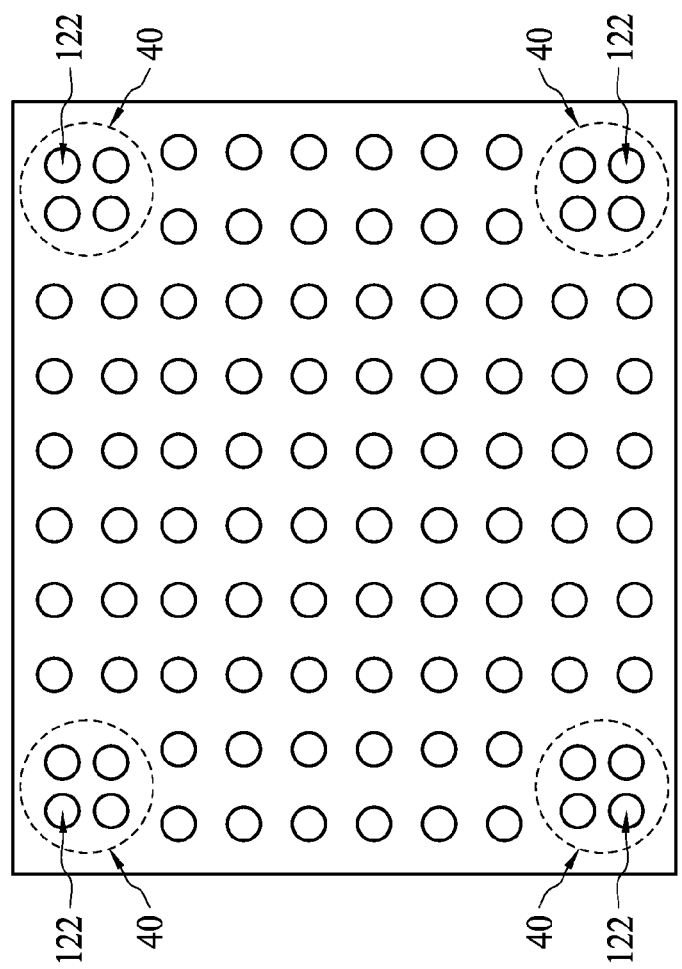
FIGS. 9-11 are plane views of various arrangements of small pitch pads on a semiconductor device according to some embodiments.
Figure 10:
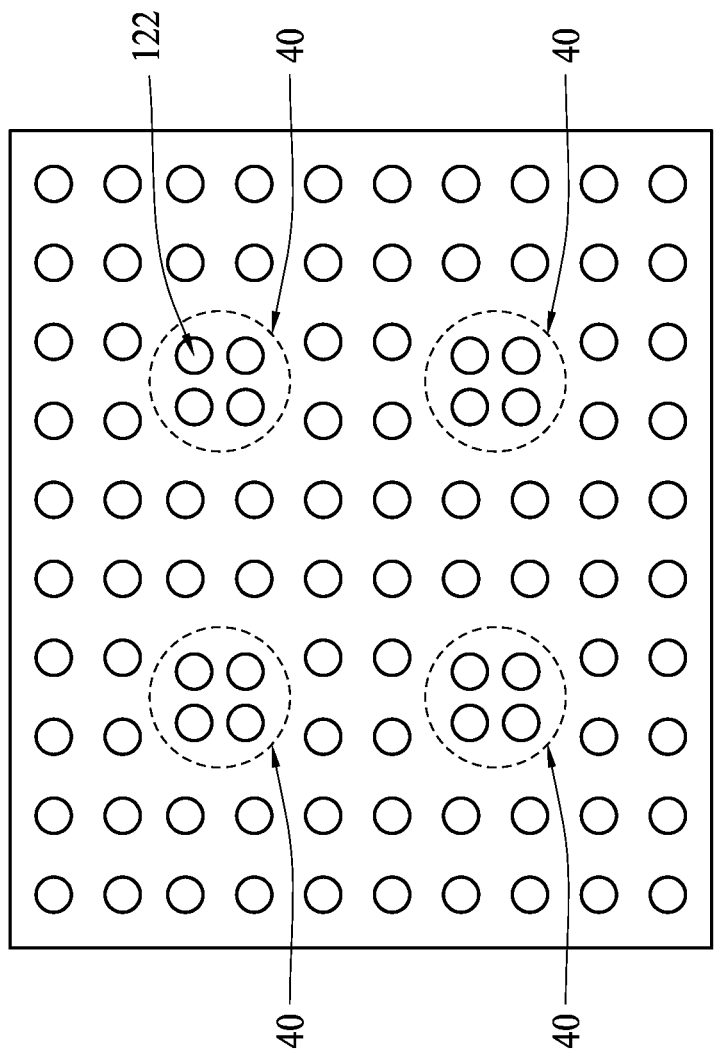
Figure 11:
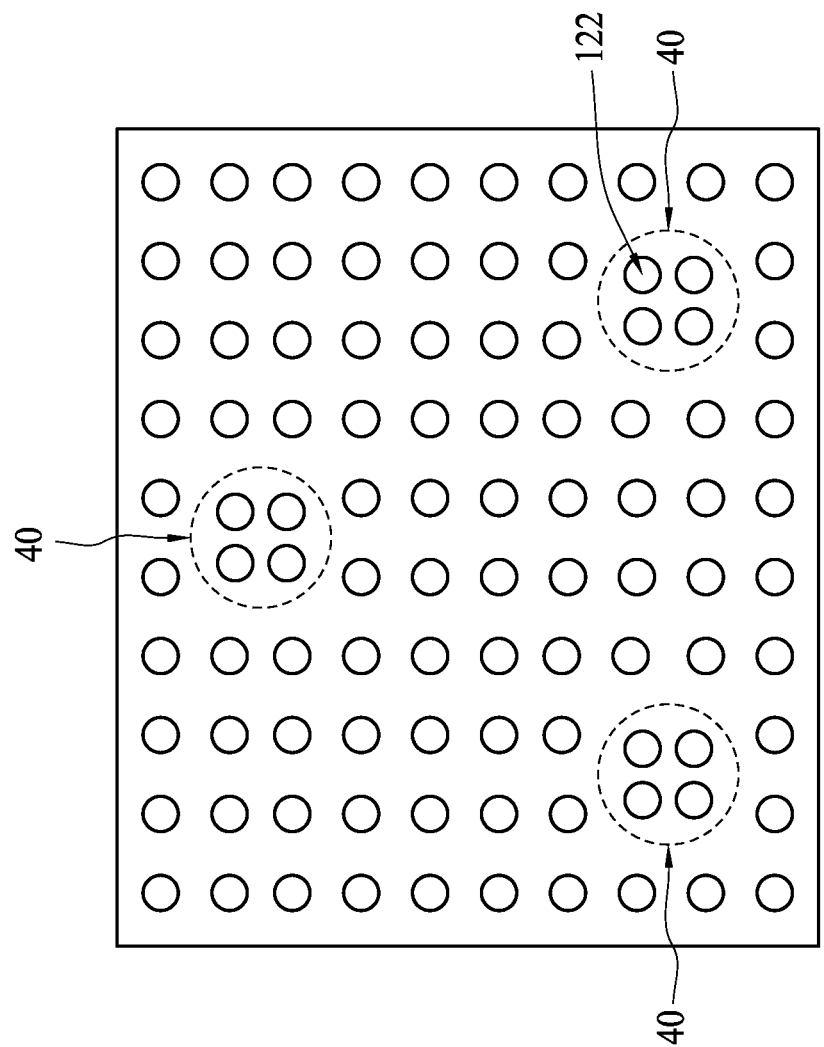

Pads with smaller pad pitch (or called small pitch pads) are arranged on a semiconductor device in various patterns. In some embodiments, the small pitch pads are arranged symmetrically to the center of the semiconductor device to ensure that the semiconductor device can evenly contact with a circuit board after mounting the semiconductor device is on the circuit board. In some embodiments, the small pitch pads are arranged to form a polygon pattern on the semiconductor device. Referring to FIG. 9, in some embodiments, a semiconductor device 100 has four groups 40 of small pitch pads 122 that are arranged as a quadrilateral. Each group 40 is located at a corner of the semiconductor device 100. Referring to FIG. 10, in some embodiments, a semiconductor device 100 has four groups 40 of small pitch pads 122. Each group 40 is located about to the center of the semiconductor device 100. Referring to FIG. 11, in some embodiments, a semiconductor device 100 has three groups 40 of small pitch pads 122. The three groups 40 form a triangle pattern on the semiconductor device that is symmetrical to the center of the semiconductor device 100. In some embodiments, a semiconductor device 100 has five, or six, or eight groups of small pitch pads and the groups pads form a pentagon, or a hexagon, or an octagon on the semiconductor device.

Figure 12:
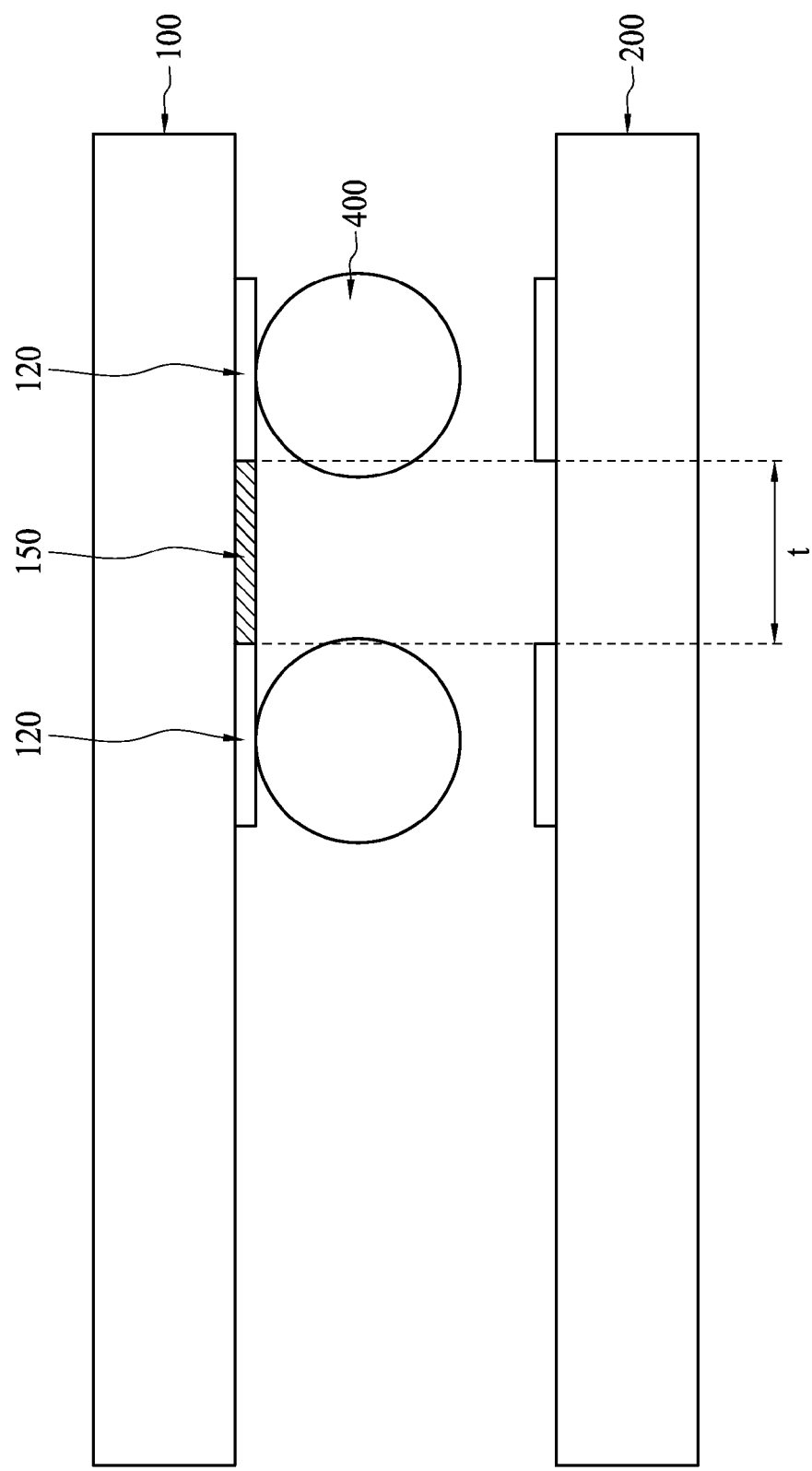
FIGS. 12-13 is a schematic of a semiconductor device having a trace disposed thereon according to some embodiments.
Figure 13:
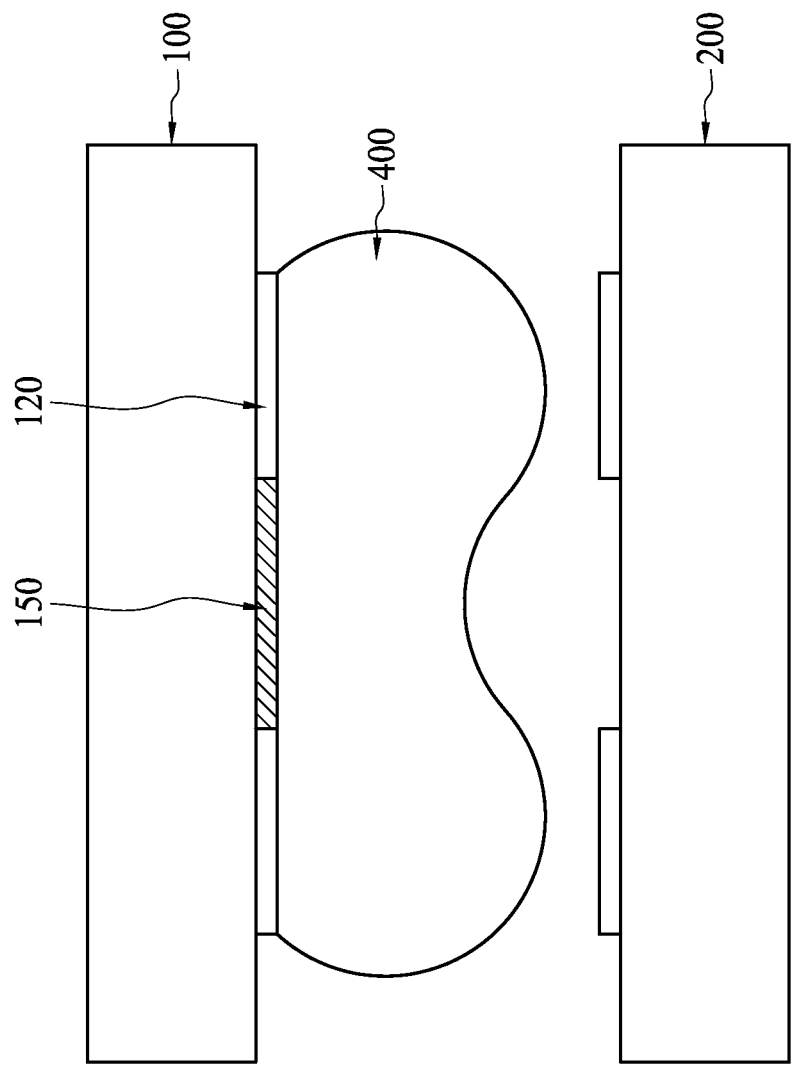

Solder balls on a number of adjacent pads can be bridged with a trace to connect several adjacent pads. In some embodiments, some pads on a semiconductor device are connected by a trace. Referring to FIG. 12, a semiconductor device 100 has a trace 150 configured to connect at least two pads 120. The trace 150 is configured to allow heated solder balls to flow along its path. The trace 150 is electrically conductive and capable of providing wetability to solder balls. In some embodiments, the trace is a metal or a metal alloy. In some embodiments, the trace is copper. In some embodiments, the width t of a trace is between about 10 µm and 200 µm. Solder balls disposed on the pads connected with a same trace are bridged after a heating operation. The heating operation provides a temperature high enough to transform the solder balls into a flowable phase in order to reform their shape. In some embodiments, the heating operation is a reflow. In FIG. 13, the solder balls 400 on the pads 120 of the semiconductor device 100 transform partially into the liquid phase. Some solder balls melt and start flowing into the trace 150 and bridging each other. In some embodiments, the width of a trace is between about 10 µm and 200 µm.

Figure 14B:
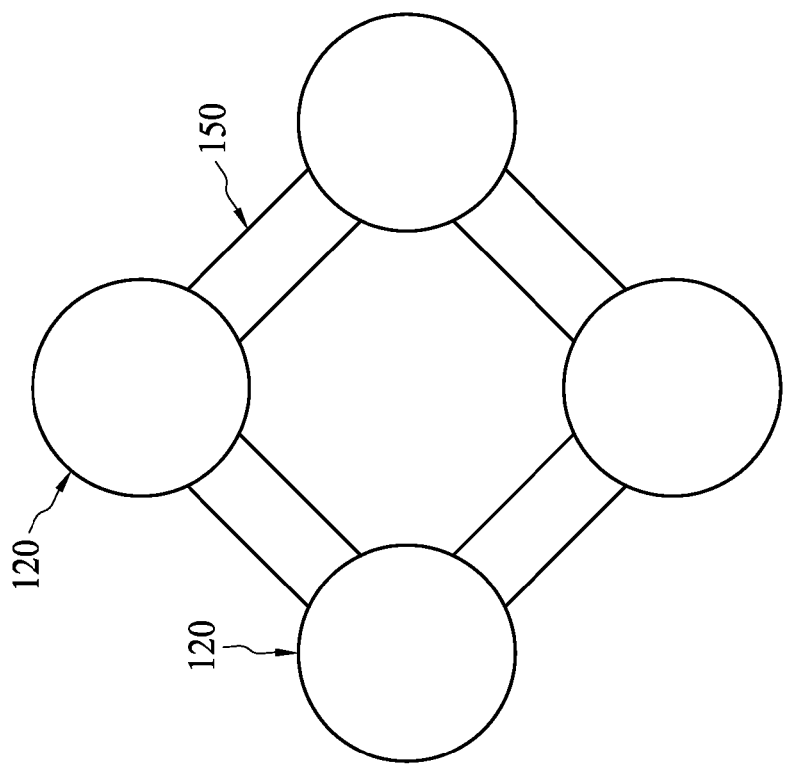
FIGS. 14A and 14B are schematic views of various design of a trace on a semiconductor device according to some embodiments.
Figure 14A:
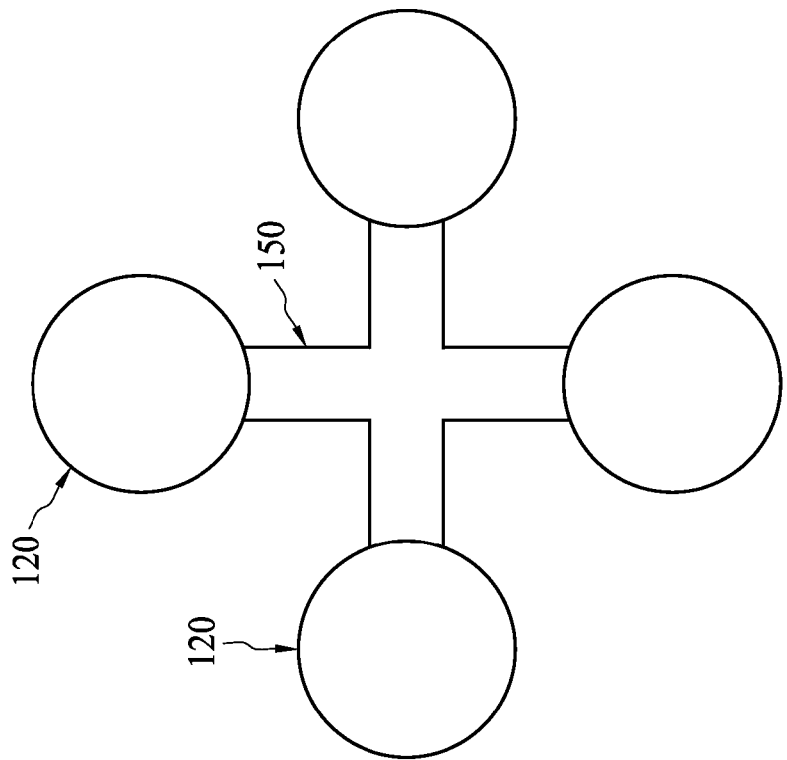

Various trace designs are adopted to form on a semiconductor device having some solder balls bridged after implementing a heating operation. In FIG. 14A, a trace 150 of a semiconductor device has a cross design. The trace 150 connects four different pads 120. Referring to FIG. 14B, in some embodiments, a trace 150 has a quadrilateral design. The trace 150 connects four different pads 120. In some embodiments, a trace is disposed on a semiconductor device and the trace is a triangle.

Figure 15:
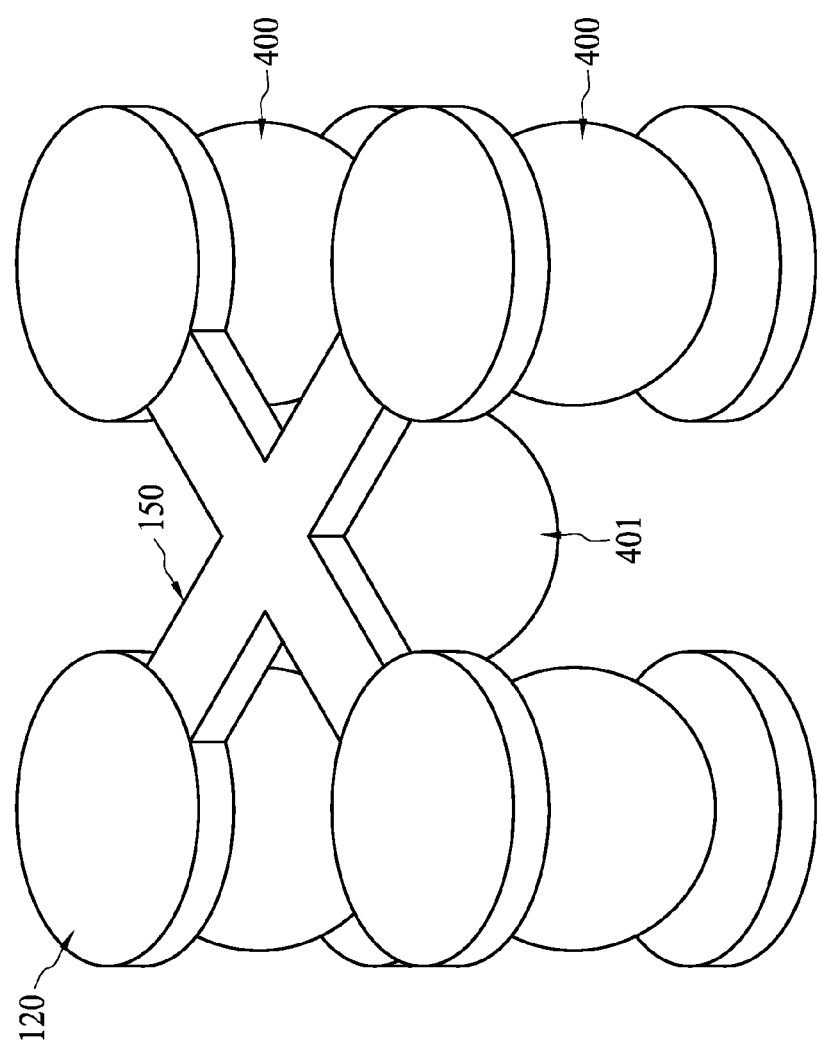
FIGS. 15 and 16 are schematic views of various designs of solder ball arrangement on a trace according to some embodiments.
Figure 16:
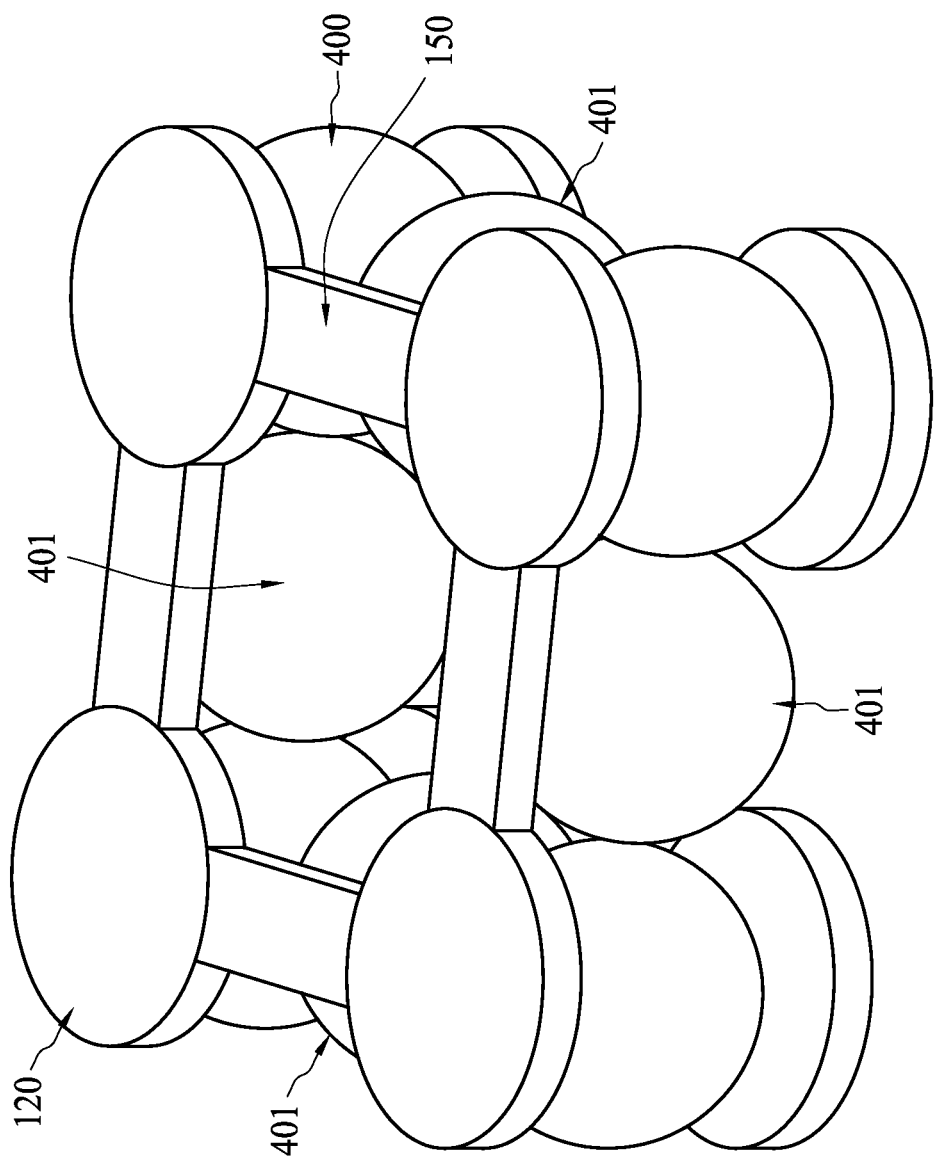

In some embodiments, some solder balls are disposed on a trace of a semiconductor device in order to promote the formation of bridged solder balls. Referring to FIG. 15, a cross trace 150 is configured to connect four pads 120. Each pad 120 has a solder ball 400 attached thereon. A solder ball 401 is disposed on the cross trace 150. In some embodiments, the solder ball 401 is disposed on the cross point of the trace 150. Referring to FIG. 16, for some embodiments, a quadrilateral trace 150 is disposed on a semiconductor device. The quadrilateral trace 150 is configured to connect four pads 120 and each pad 120 has a solder ball 400 attached thereon. There are four solder balls 401 inserted between the solder balls 400 on the trace 150.

Figure 17:
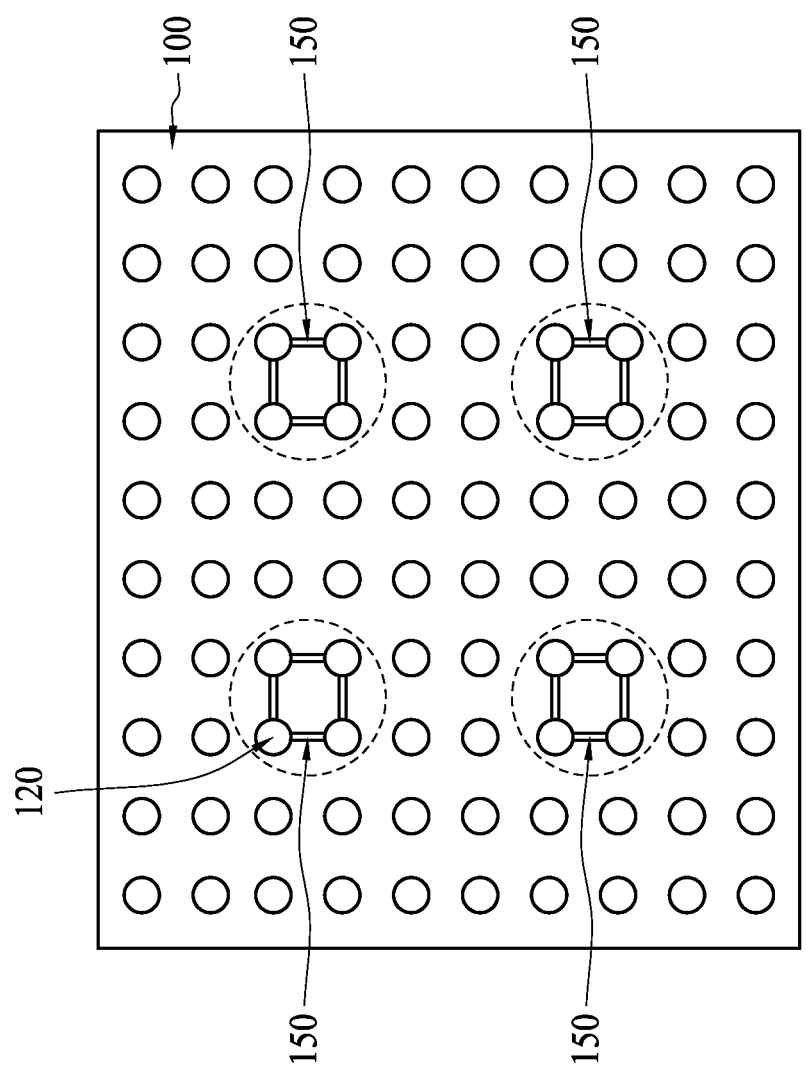
FIGS. 17-19 are plane views of various arrangements of traces on a semiconductor device according to some embodiments.
Figure 18:
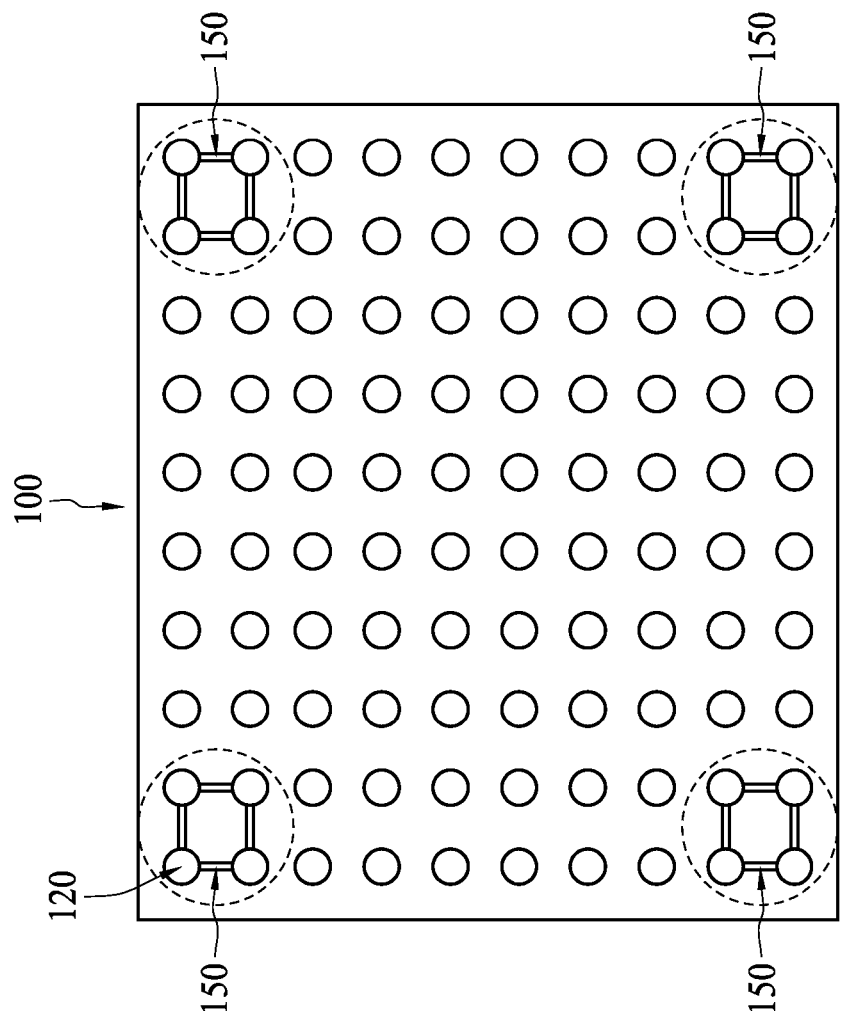
Figure 19:
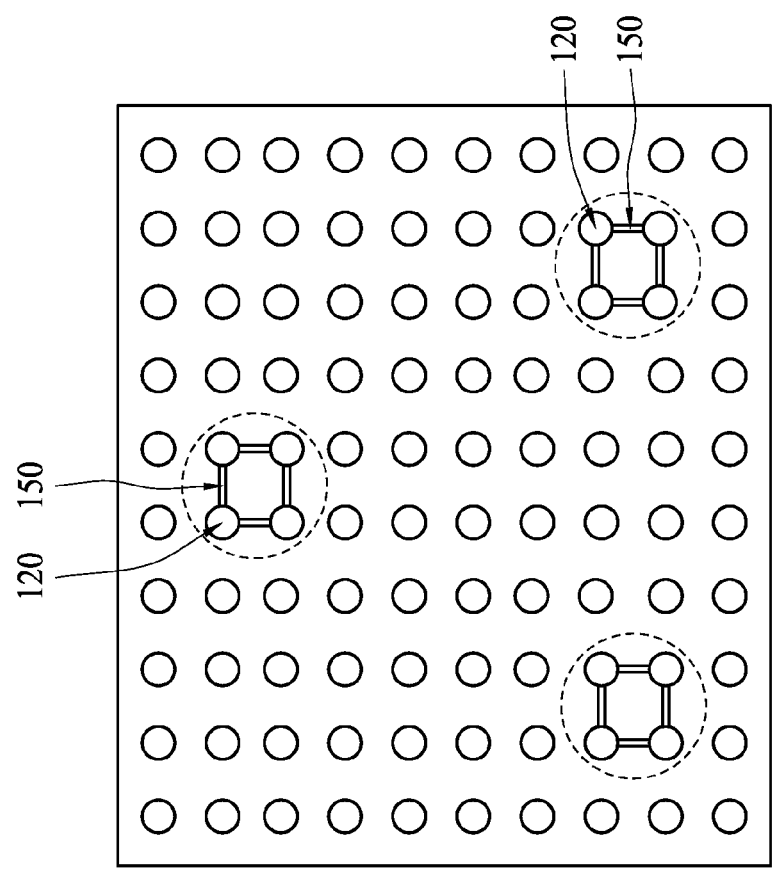

In some embodiments, there are at least two traces disposed on a semiconductor device and the traces are arranged in various patterns. In some embodiments, the traces are arranged symmetrically to the center of the semiconductor device to ensure that the semiconductor device can evenly contact with a mounting circuit board. In some embodiments, the center of form a polygon on the semiconductor device and the polygon is symmetrical to the center of the semiconductor device. In FIG. 17, a semiconductor device 100 has four traces 150 arranged as a quadrilateral on its top surface. The traces 150 are located about to the center of the semiconductor device 100. Each trace 150 connects four pads 120. Referring to embodiments of FIG. 18, a semiconductor device 100 has four traces 150 arranged as a quadrilateral and the quadrilateral is symmetrical to the center of the semiconductor device 100. The traces 150 are located at corners of the semiconductor device 100. Each trace 150 connects four pads 120. In FIG. 19, a semiconductor device 100 has three traces 150 disposed on its top surface. The traces 150 form a triangle on the semiconductor device and the triangle is symmetrical to the center of the semiconductor device 100. Each trace connects four pads 120. In some embodiments, a semiconductor device has five, six, or eight traces disposed on the semiconductor device. The traces form a pentagon, or a hexagon, or an octagon pattern on the semiconductor device.

In some embodiments, the size of the pads connected by a trace is between about 150 µm and 250 µm. In some embodiment, the pad size is about 200 µm. In some embodiments, the thickness of the pads connected by a trace is between about 6 µm and 10 µm. In some embodiments, the thickness of the pads connected by a trace is about 8 µm. In some embodiments, the pitch of the pads connected by a trace is between about 300 µm and 400 µm. In some embodiments, the pitch of the pads connected by a trace is about 350 µm.

In some embodiments, a trace-included semiconductor device is configured to be mounted on a circuit board. The circuit board has a number of contact pads corresponding to the pads of the semiconductor device. The pad size of the contact pads is between about 150 µm and 250 µm. In some embodiments, the pad size of the contact pads is about 200 µm. In some embodiments, the pitch of the contact pads is between about 300 µm and 400 µm. In some embodiments, the pitch of the contact pads is 350 µm.

Contact pads on a circuit board are arranged in various manners to have at least two different profiles for solder bumps to be formed in a surface mounting component or a chip scale package assembly. In some embodiments, some contact pads are designed to be smaller than the other contact pads on a circuit board. Solder balls bonded with the larger contact pads are elongated after mounting a semiconductor device on the circuit board. In some embodiments, some contact pads are designed to be thicker than the other contact pads on a circuit board. Solder balls bonded with the thinner contact pads are elongated after mounting a semiconductor device on the circuit board. In some embodiments, a presolder is first disposed on some contact pads. Solder balls bonded on the contact pads without presolder disposed are elongated after mounting a semiconductor device on the circuit board. In some embodiments, a conductive post is first disposed on some contact pads. Solder balls bonded on the contact pads without conductive post disposed are elongated after mounting a semiconductor device on the circuit board.

Figure 20:
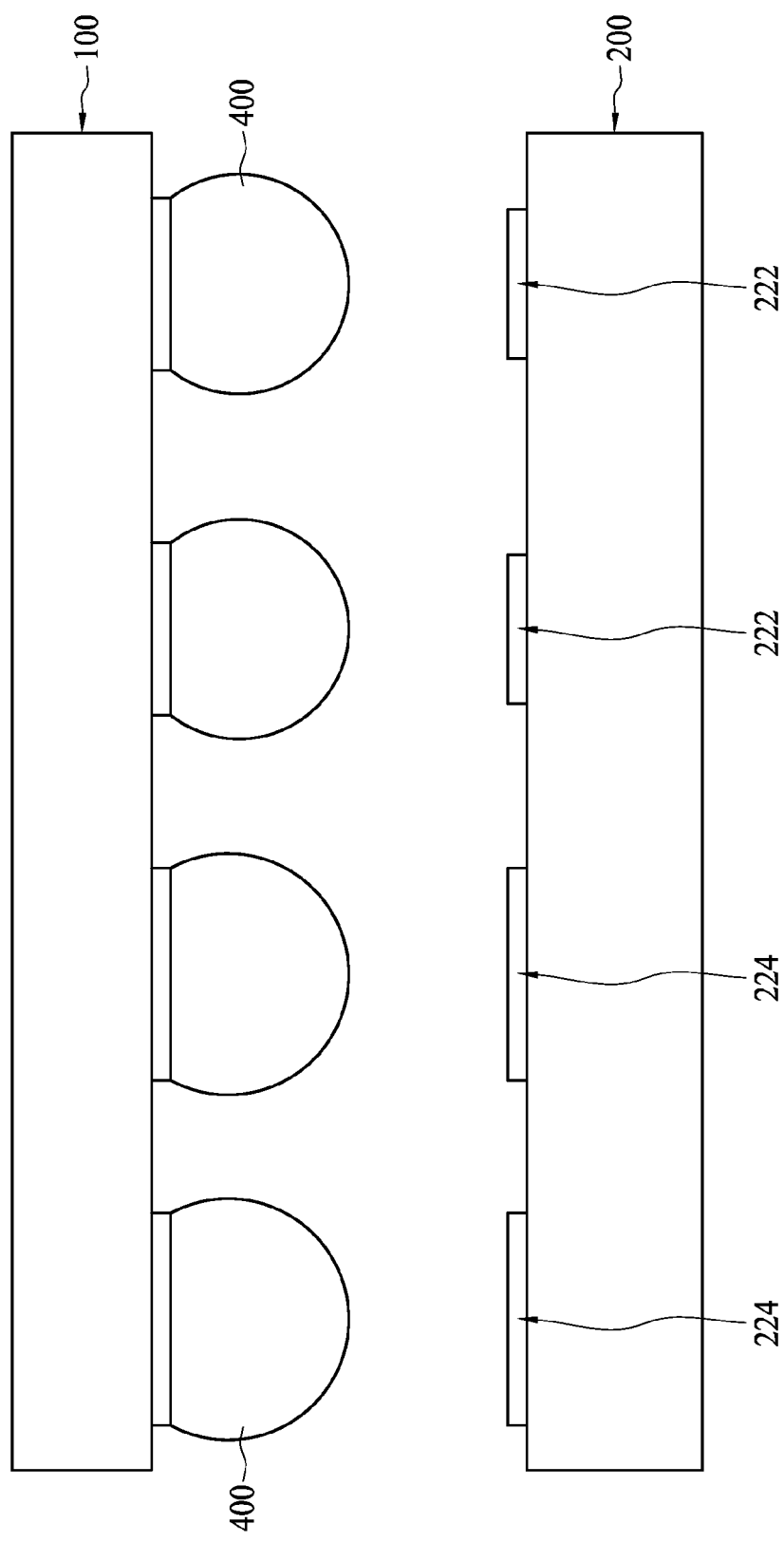
FIG. 20 is a schematic of a surface mounting component or a chip scale package assembly having a plurality of contact pads featured with two different pad sizes.
Figure 21:
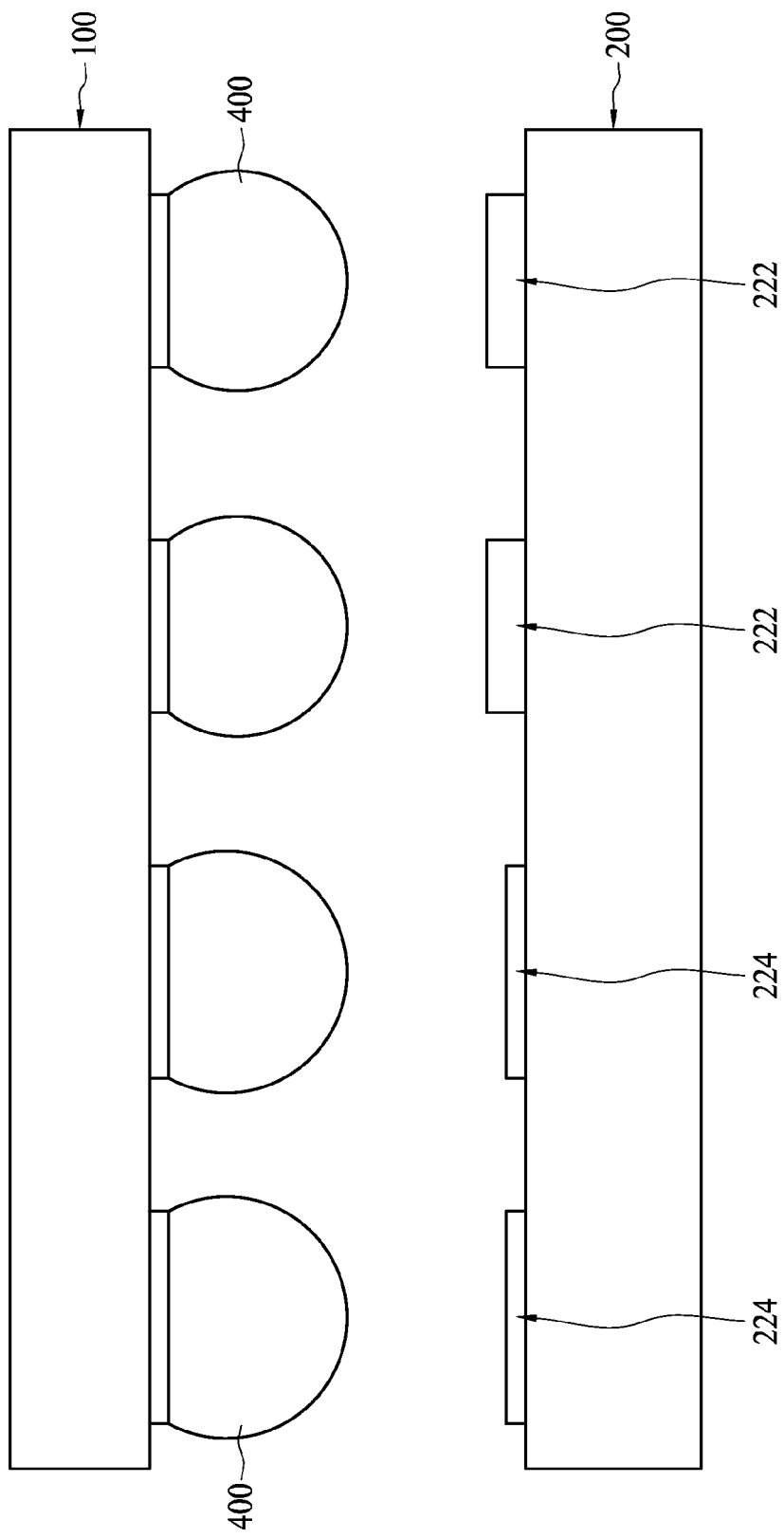
FIG. 21 is a schematic of a surface mounting component or a chip scale package assembly having a plurality of contact pads featured with two different pad thickness.

Referring to embodiments of FIG. 20, a circuit board 200 has a first type contact pads 222 and a second type contact pad 224. Contact pads of the first type have smaller pad size than contact pads of the second type. Referring to embodiments of FIG. 21, a circuit board 200 has a first type contact pads 222 and a second type contact pad 224. The thickness for the first type contact pad 222 is thicker than the second type contact pad 224.

In addition to adjusting the size, pitch or thickness of pads on either a semiconductor device or a circuit board, in some embodiments, solder volume is arranged differently for some pads on a semiconductor device. In some embodiments, some solder balls are configured to have a larger volume than other solder balls. The volume difference is between about 10% and about 50%. In some embodiments, diameter for the large solder balls is around 230 µm and 200 µm for the small solder balls. In some embodiments, the space between some solder balls is arranged to be at least larger than 50 µm. In some embodiments, the diameter of the solder balls is at least larger than 250 µm.

Figure 22:
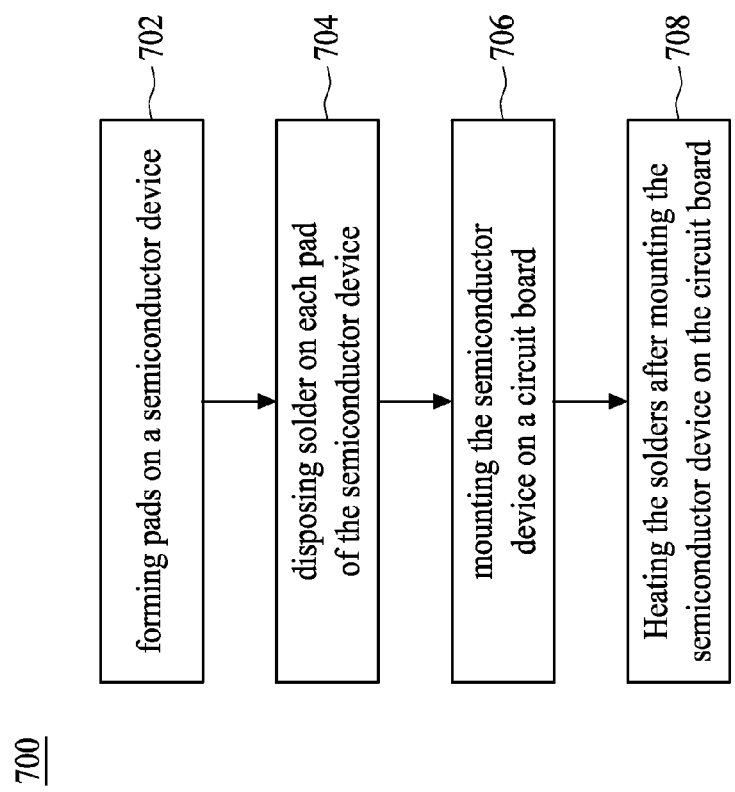
FIG. 22 is a flow diagram of a surface mounting method for some embodiments according to the present disclosure.

Referring to FIG. 22, in some embodiments, a surface mounting component is formed by a method 700. The method 700 includes a number of operations and the description and illustration are not deemed as a limitation as the order of the operations. According to the present disclosure, the order of the operations are interchangeable.

A semiconductor device is provided and configured to be mounted on a circuit board in order to form a surface mounting component. In some embodiments, the method 700 is adopted to form a chip scale semiconductor package assembly.

In operation 702, a number of pads are formed on a semiconductor device. The pads are arranged in various manners according to the present disclosure. In some embodiments, a pad grid is formed on the semiconductor device. In some embodiments, there are two groups of pads formed on the semiconductor device according to their pad size. Pads in the same group have a substantially same pad size. In some embodiments, pads with a smaller pad size are located on several zones. Pattern of the zones is symmetrical to the center of the semiconductor device. In some embodiments, the zone pattern is a polygon and the polygon is symmetrical to the center of the semiconductor device.

In some embodiments, pads on a semiconductor device are grouped into two different types according to their pad pitch. For pads in the same group, the pad pitch is substantially the same. In some embodiments, pads with smaller pitch are located on several zones on the semiconductor device. The zone pattern is symmetrical to the center of the semiconductor device. In some embodiments, the zone pattern is a polygon and the polygon is symmetrical to the center of the semiconductor device.

In some embodiments, the method 700 includes an operation to form a trace on a semiconductor device. The trace connects at least two pads on the semiconductor device. In some embodiments, the trace is a cross, a triangle, or a quadrilateral. In some embodiments, there are at least two traces formed on a semiconductor device, and each trace connects at least two pads. In some embodiments, there are at least three traces formed on the semiconductor device and arranged to form a polygon. The polygon is symmetrical to the center of the semiconductor device. In some embodiments, the polygon is a triangle, or a quadrilateral. In some embodiments, the traces are located about to the center of the semiconductor device. In some embodiments, the traces are formed about to the corners of the semiconductor device.

In some embodiments, the method 700 includes an operation of forming a number of contact pads on a circuit board. The circuit board is configured to receive a semiconductor device with a surface mounting. In some embodiments, there are two types of contact pads formed on a circuit board according to their pad size. Contact pads of the same type have a substantially same pad size. In some embodiments, contact pads with small pad size are arranged too located at several zones. Pattern of the zones is designed to let the semiconductor device contact evenly with the circuit board. In some embodiments, the zone pattern is symmetrical to the center of the circuit board. In some embodiments, the zone pattern is a polygon and the polygon is symmetrical to the center of the circuit board.

In some embodiments, the method 700 includes an operation to form a larger thickness on some contact pads of a circuit board. Contact pads with a larger thickness are arranged to locate at several zones on the circuit board. The arrangement is to ensure a semiconductor device contacting evenly with the circuit board. In some embodiments, to form the thicker contact pads is by an operation of disposing a presolder on some contact pads. In some embodiments, the thicker contact pads are formed by disposing a conductive post on some the contact pads.

Solder balls are disposed on the pads of the semiconductor device in operation 704. In some embodiments, each pad receives a solder ball and the volume is substantially same for each solder ball. In some embodiments, a solder ball is disposed on a trace which is configured to connect some pads. In some embodiments, each of some pads are configured to receive solders with a larger volume than the other pads.

In some embodiments, the method 700 includes an operation of bonding the solder balls to the pads of the semiconductor device. In some embodiments, the solder balls are heated under an infrared lamp or an oven. In some embodiments, an operation of applying flux on the pads before disposing the solder balls on the pads is included.

In operation 706, the semiconductor device is mounted to a circuit board. In some embodiments, the method 700 included an operation 708 of heating the solder balls after mounting the semiconductor device on the circuit board. During the operation, solder balls are heated to form solder bumps between the semiconductor device and the circuit board. In some embodiments, some solder bumps are formed to have a wetting angle Φ smaller than 100 degrees, wherein the wetting angle Φ is the angle between the solder bump and the contact pad. In some embodiments, some solder bumps are formed to have a wetting angle Φ smaller than 90 degrees.

In some embodiments, some solder balls are reflowed during operation 708 and several bridged solder balls are formed. In some embodiments, solder balls on the small pitch pads of the semiconductor device form several bridged solder balls. Distribution of the bridged solder balls follows the zone pattern of the small pitch pads. In some embodiments, solder balls on the traces and the pads connected by the traces form several bridged solder balls. Distribution of the bridged solder balls is determined by the arrangement of the traces. The bridged solder balls form several solder bumps with a bigger wetting angle Φ. In some embodiments, solder bumps formed by the bridged solder balls have a bigger contact surface with the semiconductor device than other solder bumps. In some embodiments, solder bumps formed by unbridged solder balls are elongated after operation 708.

Figure 23:
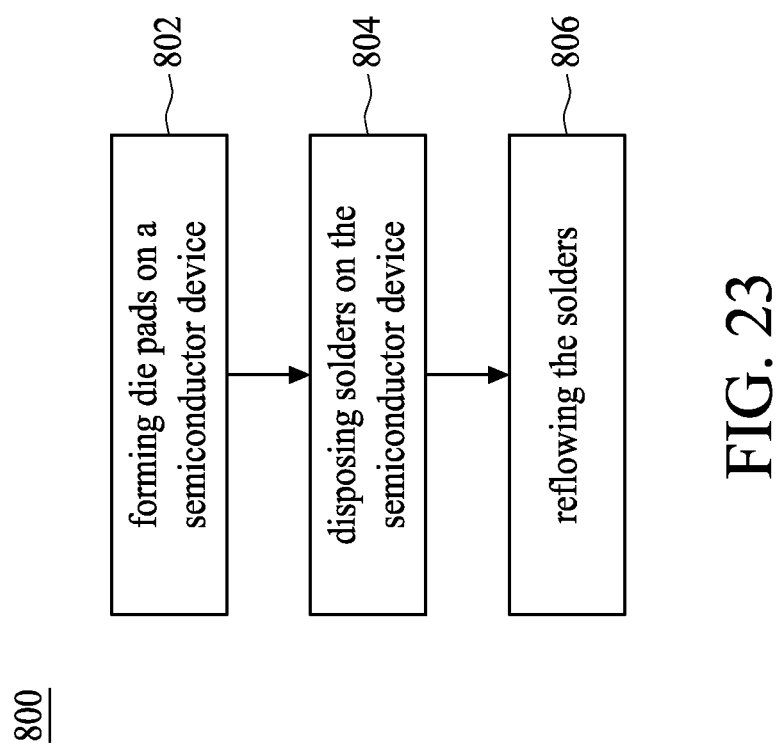
FIG. 23 is a flow diagram of a surface mounting method for some embodiments according to the present disclosure.

FIG. 23 is a method 800 of forming a surface mounting component or a chip scale package assembly. In operation 802, a number of die pads are formed on a semiconductor device. There are various ways to arrange the die pads on the semiconductor device. The arrangements are configured to form a number of bridged solder balls during a reflow process. The arrangements are also configured to form two different types solder bumps in a surface mounting component or a chip scale package assembly according to the profile features. The profile features includes a wetting angle between the solder bump and the die pad, a wetting angle between the solder bump and a contact pad of a circuit board, or the aspect ratio of the solder bump. In some embodiments, the pad pitch is between about 290 um and 320 um.

In some embodiments, the method 800 includes an operation of forming a number of conductive traces on a semiconductor device and each trace connects at least two pads on the semiconductor device. In some embodiments, the pad pitch is between about 300 μm and 400 μm. In some embodiment, the width of the traces is between about 10 μm and 200 μm.

In operation 804, a number of solder balls are disposed on the semiconductor device. In some embodiments, each die pad receives one solder ball. In some embodiments, each trace receives at least one solder ball. In some embodiments, each trace receives four solder balls. In some embodiments, the solder ball has a diameter between about 180 μm and 220 μm. In some embodiments, the diameter of the solder balls between about 230 μm and 270 μm.

In operation 806, a reflow is introduced. During the reflow, some solder balls are merged to form several bridged solder balls. In some embodiments, the bridged solder balls are formed on the semiconductor device before mounting the semiconductor device on a circuit board. In some embodiments, the bridged solder balls are formed on the semiconductor device after mounting the semiconductor device on a circuit board.

There are a number of techniques for reflowing a solder ball. One is to use infrared lamps; this is called infrared reflow. One is to use a hot gas convection. Another technology which is special fluorocarbon liquids with high boiling points which use a method called vapor phase reflow.

The bridged solder balls are arranged in a pattern configured to have an even contact between a semiconductor device and a circuit board when the semiconductor device is surface mounted on the circuit board. In some embodiments, the bridged solder balls are arranged about to the center of the semiconductor device. In some embodiments, the bridged solder balls are arranged about to the corners of the semiconductor device.

A surface mounting semiconductor component includes a semiconductor device, a circuit board, a number of first solder bumps, and a number of second solder bumps. The semiconductor device included a number of die pads. The circuit board includes a number of contact pads. The first solder bumps are configured to bond the semiconductor device and the circuit board. Each of the first solder bumps connects at least two die pads with a corresponding contact pad. Each of the second solder bumps connects a die pad with a corresponding contact pad.

A chip scale semiconductor package assembly includes a semiconductor chip, a circuit board, and a number of first solder bumps. The semiconductor chip includes a number of first metallurgical pads and a number of second metallurgical pads. The circuit board includes a number of first contact pads and a number of second contact pads. Each of the first solder bumps respectively connects only one second contact pad and each of the first solder bumps has a wetting angle smaller than 90 degrees with the second contact pad.

A surface mounting method includes forming a number of metallurgical pads on a semiconductor device. The surface mounting method includes an operation of disposing a number of solder balls on each of the metallurgical pads. The surface mounting method further includes an operation of mounting the semiconductor device to a circuit board. The surface mounting method further includes an operation of heating the solder balls to form a number of solder bumps, wherein some of the number of solder bumps have a wetting angle smaller than 90 degrees.

The methods and features of this invention have been sufficiently described in the above examples and descriptions. It should be understood that any modifications or changes without departing from the spirit of the invention are intended to be covered in the protection scope of the invention.

What is claimed is:

1. A chip scale semiconductor package assembly, comprising:
   a first device having a first mounting surface that includes a plurality of conductive die pads, each of the conductive die pads being separated from each other from a top view perspective;
   a second device having a second mounting surface that includes a plurality of contact pads, wherein a number of the conductive die pads is greater than that of the contact pads;
   a plurality of first solder bumps, wherein each of the first solder bump-is in direct contact with more than one of the conductive die pads; and
   a plurality of second solder bumps, each of which connects one of the plurality of conductive die pads with one of the plurality of contact pad in a one to one correspondence,
   wherein a volume of each of the first solder bumps is substantially an integer multiple of that of each of the second solder bumps;
   wherein an aspect ratio of each of the first solder bumps is smaller than that of each of the second solder bumps.

2. The assembly of claim 1, wherein a pitch of adjacent conductive die pads connected with the first solder bumps is at least 20% smaller than a pitch of adjacent conductive die pads connected with the second solder bumps.

3. The assembly of claim 1, further comprising a trace on the first device, wherein the trace connects adjacent conductive die pads connected to each of the first solder bumps.

4. The assembly of claim 3, wherein each of the first solder bumps wets over the adjacent conductive die pads and the trace.

5. The assembly of claim 1, wherein a wetting angle between each of the second solder bumps and the corresponding contact pad is smaller than a wetting angle between each of the first solder bumps and the corresponding contact pad.

6. The assembly of claim 1, wherein the aspect ratio of the each of the second solder bumps is 50% greater than the aspect ratio of each of the first solder bumps.

7. The assembly of claim 1, wherein a wetting angle of each of the plurality of second solder bumps is smaller than a wetting angle of each of the plurality of the first solder bumps.

8. The assembly of claim 1, wherein the plurality of first solder bumps are arranged symmetrically to a center of the first mounting surface.

9. The assembly of claim 8, wherein the plurality of first solder bumps are arranged in a polygonal pattern on the first mounting surface.

10. A chip scale semiconductor package assembly, comprising:
   a first device having a first mounting surface that includes a plurality of conductive die pads, each of the conductive die pads being separated from each other from a top view perspective;

a second device having a second mounting surface that includes a plurality of contact pads, wherein a number of the conductive die pads is greater than that of the contact pads;

a plurality of first solder bumps, wherein each of the first solder bump-is in direct contact with more than one of the conductive die pads; and a plurality of second solder bumps, each of which connects one of the plurality of conductive die pads with one of the plurality of contact pad in a one to one correspondence, wherein a size of a contact surface between each of the first solder bumps and the first device is an integer multiple of a size of a contact surface between each of the second solder bumps and the first device.

11. The chip scale semiconductor package assembly of claim 10, a volume of each of the first solder bumps is substantially an integer multiple of that of each of the second solder bumps.

12. The chip scale semiconductor package assembly of claim 10, wherein the size of the contact surface between each of the second solder bumps and the first device is 30% less than the size of the contact surface between each of the first solder bumps and the first device.

13. The chip scale semiconductor package assembly of claim 10, wherein a height of each of the first solder bumps is the same as a height of each of the second solder bumps.

14. The chip scale semiconductor package assembly of claim 10, wherein the plurality of first solder bumps are arranged as a quadrilateral on the first mounting surface.

15. A chip scale semiconductor package assembly, comprising:

a first device having a first mounting surface that includes a plurality of conductive die pads, each of the conductive die pads being separated from each other from a top view perspective;

a second device having a second mounting surface that includes a plurality of contact pads, wherein a number of the conductive die pads is greater than that of the contact pads;

a plurality of first solder bumps, wherein each of the first solder bump is in direct contact with more than one of the conductive die pads; and a plurality of second solder bumps, each of which connects one of the plurality of conductive die pads with one of the plurality of contact pad in a one to one correspondence, wherein a volume of each of the first solder bumps is substantially an integer multiple of that of each of the second solder bumps.

16. The chip scale semiconductor assembly of claim 15, wherein the size of the contact surface between each of the second solder bumps and the first device is different than the size of the contact surface between each of the first solder bumps and the first device.

17. The chip scale semiconductor assembly of claim 15, wherein the first solder bump has a larger size of the contact surface between the first solder bump and the first device than the contact surface between the first solder bump and the second device.

18. The chip scale semiconductor assembly of claim 15, further comprising a trace on the first device, wherein the trace connects adjacent conductive die pads.

* * * * *